(12) United States Patent
Lilak et al.

(10) Patent No.: US 10,910,405 B2
(45) Date of Patent: Feb. 2, 2021

(54) BACKSIDE FIN RECESS CONTROL WITH MULTI-HSI OPTION

(71) Applicant: Intel Corporation, Santa Clara, CA (US)

(72) Inventors: Aaron D. Lilak, Beaverton, OR (US); Patrick Morrow, Portland, OR (US); Stephen M. Cea, Hillsboro, OR (US); Rishabh Mehandru, Portland, OR (US); Cory E. Weber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/785,986

(22) Filed: Feb. 10, 2020

(65) Prior Publication Data
US 2020/0176482 A1    Jun. 4, 2020

Related U.S. Application Data

(62) Division of application No. 15/752,241, filed as application No. PCT/US2015/052288 on Sep. 2, 2015, now Pat. No. 10,600,810.

(51) Int. Cl.
*H01L 27/12* (2006.01)
*H01L 29/78* (2006.01)
(Continued)

(52) U.S. Cl.
CPC .... *H01L 27/1211* (2013.01); *H01L 21/26506* (2013.01); *H01L 21/26513* (2013.01);
(Continued)

(58) Field of Classification Search
CPC .......................... H01L 27/0886; H01L 21/302
See application file for complete search history.

(56) References Cited

U.S. PATENT DOCUMENTS

| 9,349,868 B1 | 5/2016 | Balakrishnan |
| 2005/0205944 A1 | 9/2005 | Clark et al. |
| (Continued) | | |

FOREIGN PATENT DOCUMENTS

WO    WO-2007120293    10/2007

OTHER PUBLICATIONS

International Search Report and Written Opinion for International Patent Application No. PCT/US2015/052288 dated Jun. 21, 2016, 12 pgs.
(Continued)

*Primary Examiner* — Stephen M Bradley
*Assistant Examiner* — Wasiul Haider
(74) *Attorney, Agent, or Firm* — Schwabe, Williamson & Wyatt, P.C.

(57) ABSTRACT

Embodiments of the present invention are directed to formation of fins with different active channel heights in a tri-gate or a Fin-FET device. In an embodiment, at least two fins are formed on a front side of the substrate. A gate structure extends over a top surface and a pair of sidewalls of at least a portion of the fins. In an embodiment, the substrate is thinned to expose the bottom surface of the fins. Next, backside etching may be performed on each fin to form active channel regions. The fins may be recessed to different depths, forming active channel regions with differing heights.

20 Claims, 18 Drawing Sheets

(51) Int. Cl.
  *H01L 21/265* (2006.01)
  *H01L 29/66* (2006.01)
  *H01L 21/8234* (2006.01)
  *H01L 27/088* (2006.01)
  *H01L 21/3115* (2006.01)
  *H01L 21/84* (2006.01)
  *H01L 21/306* (2006.01)

(52) U.S. Cl.
  CPC .............. *H01L 21/31155* (2013.01); *H01L 21/823431* (2013.01); *H01L 21/845* (2013.01); *H01L 27/0886* (2013.01); *H01L 29/66795* (2013.01); *H01L 29/78* (2013.01); *H01L 29/785* (2013.01); *H01L 21/30604* (2013.01)

(56) References Cited

U.S. PATENT DOCUMENTS

| | | |
|---|---|---|
| 2008/0128797 A1 | 6/2008 | Dyer |
| 2008/0224258 A1 | 9/2008 | Schepis et al. |
| 2010/0258870 A1 | 10/2010 | Hsu et al. |
| 2012/0313169 A1 | 12/2012 | Wahl et al. |
| 2013/0062699 A1 | 3/2013 | Zhu |
| 2014/0001560 A1 | 1/2014 | Cappellani |
| 2014/0159163 A1 | 6/2014 | Cai |
| 2014/0284723 A1* | 9/2014 | Lee ................. H01L 21/823821 257/369 |
| 2015/0124071 A1 | 7/2015 | Chih |
| 2017/0005195 A1 | 1/2017 | Ching |

OTHER PUBLICATIONS

International Preliminary Search Report for International Patent Application No. PCT/US2015/052288 dated Apr. 5, 2018, 9 pages.
Office Action from Taiwan Patent No. 105125636, dated Oct. 24, 2019, 17 pages.
Decision of Rejection from Taiwan Patent No. 105125636, dated Feb. 14, 2020, 5 pages.

* cited by examiner

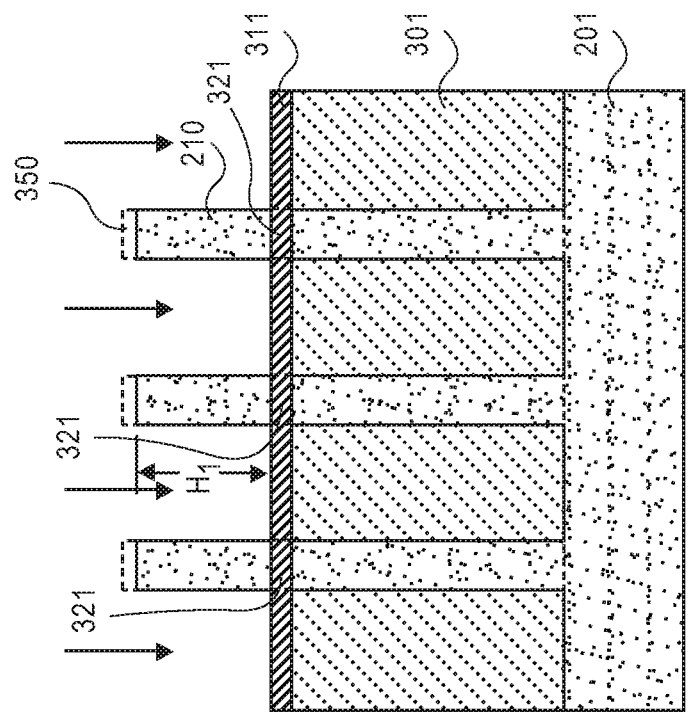
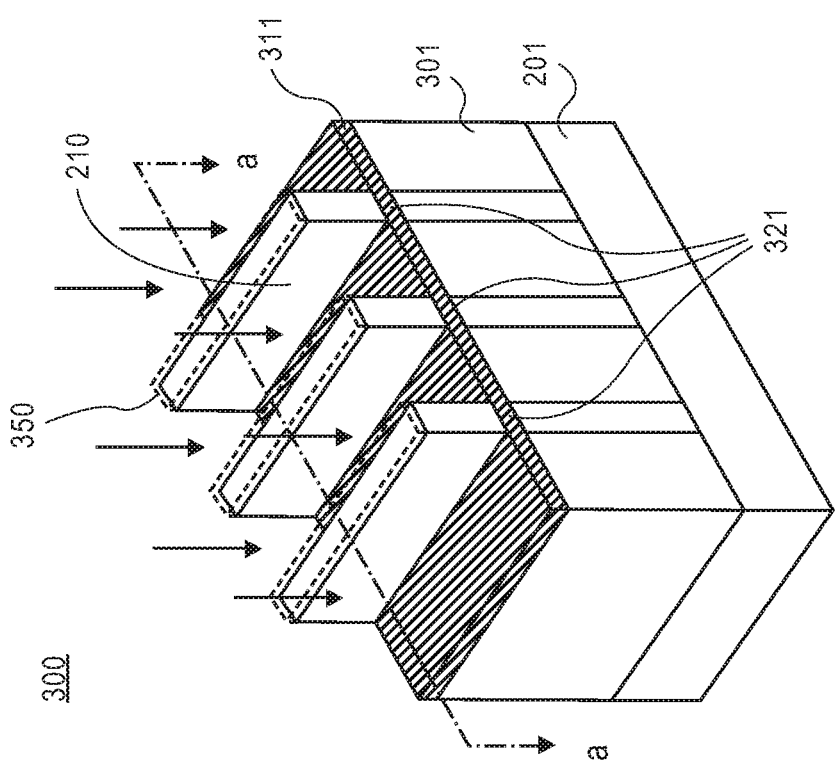

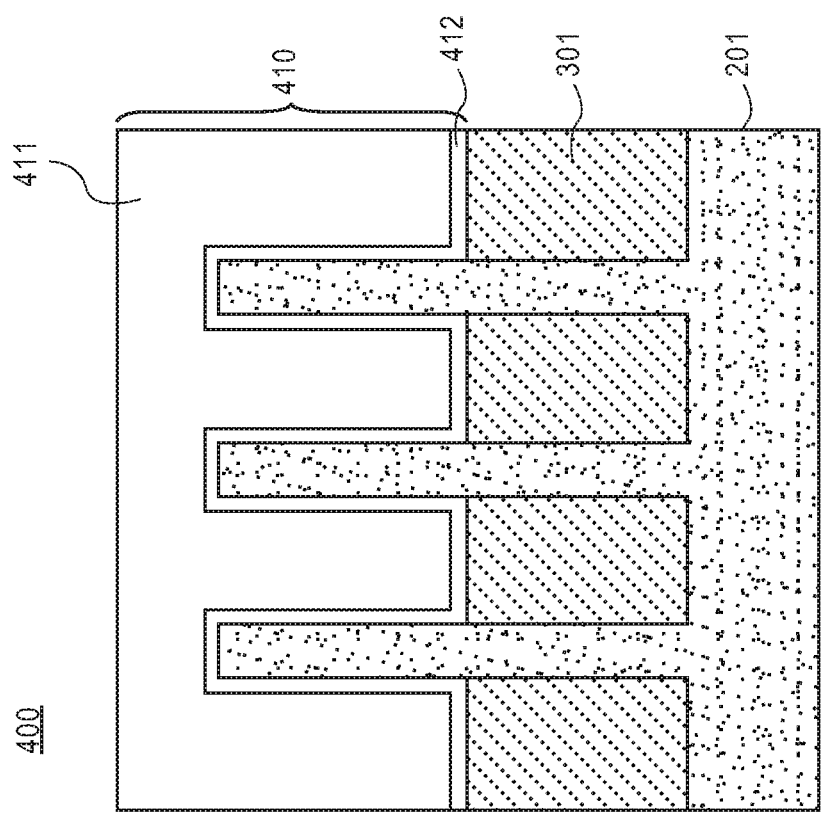
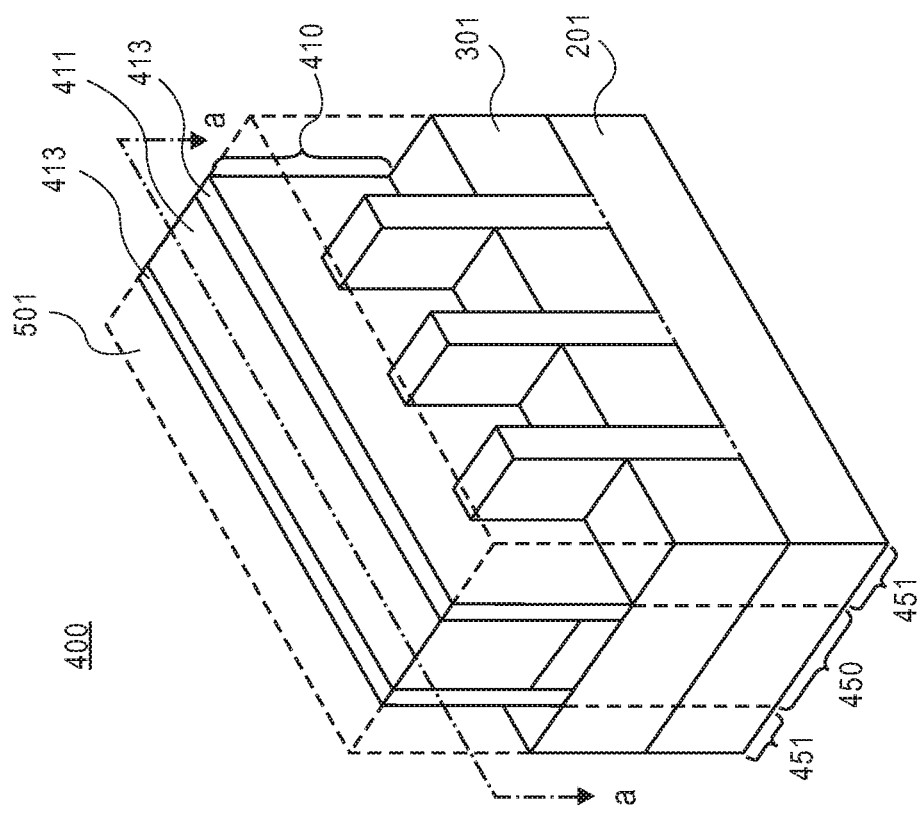
FIG. 4B
FIG. 4A

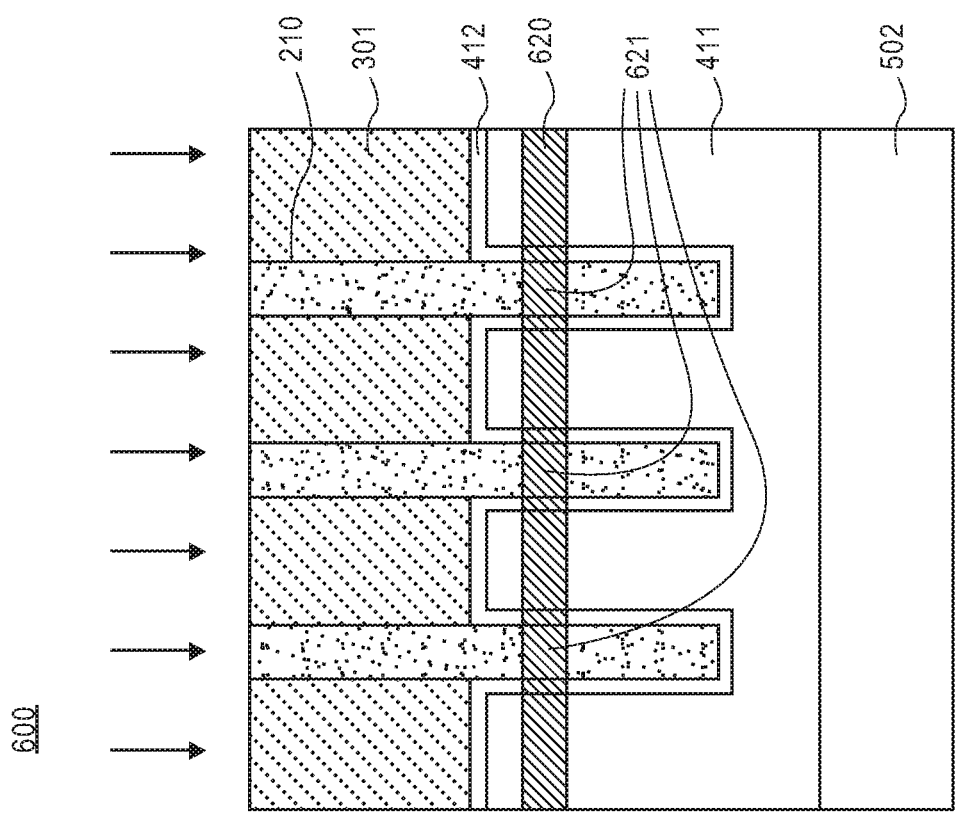
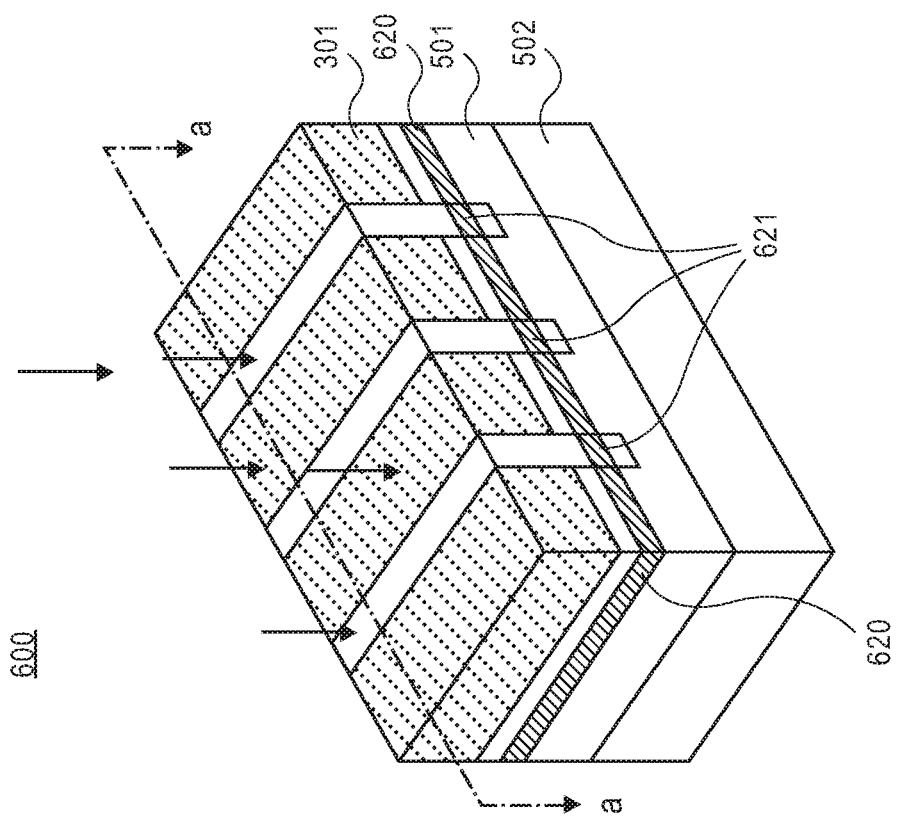
FIG. 6D
FIG. 6C

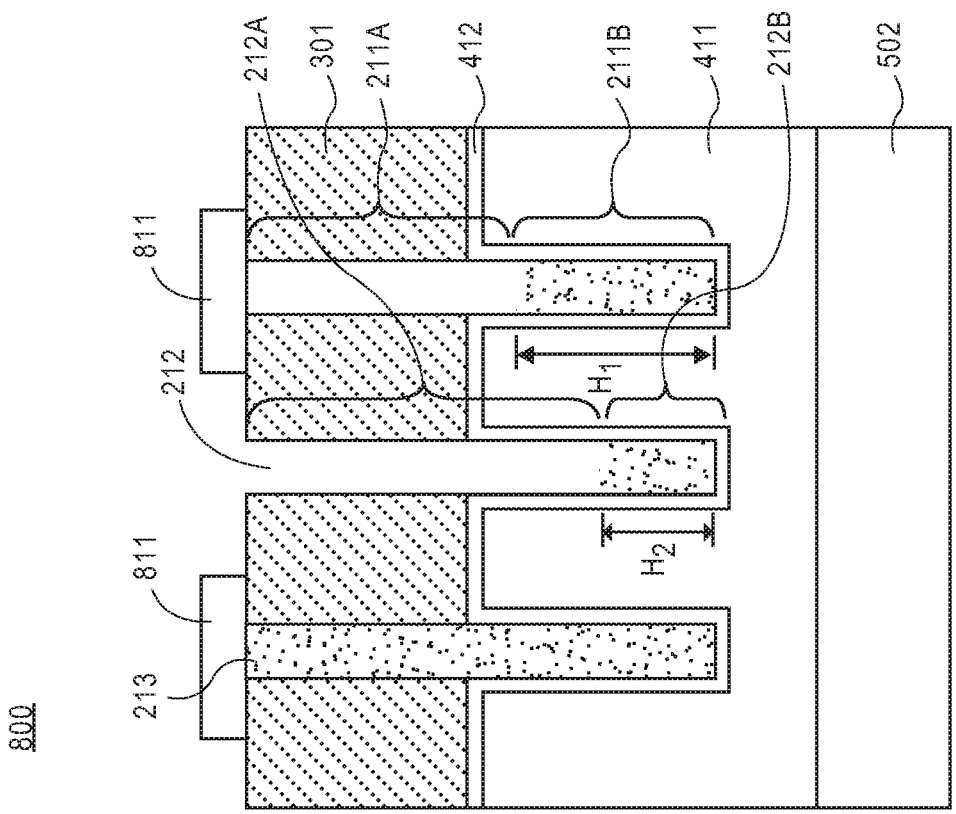
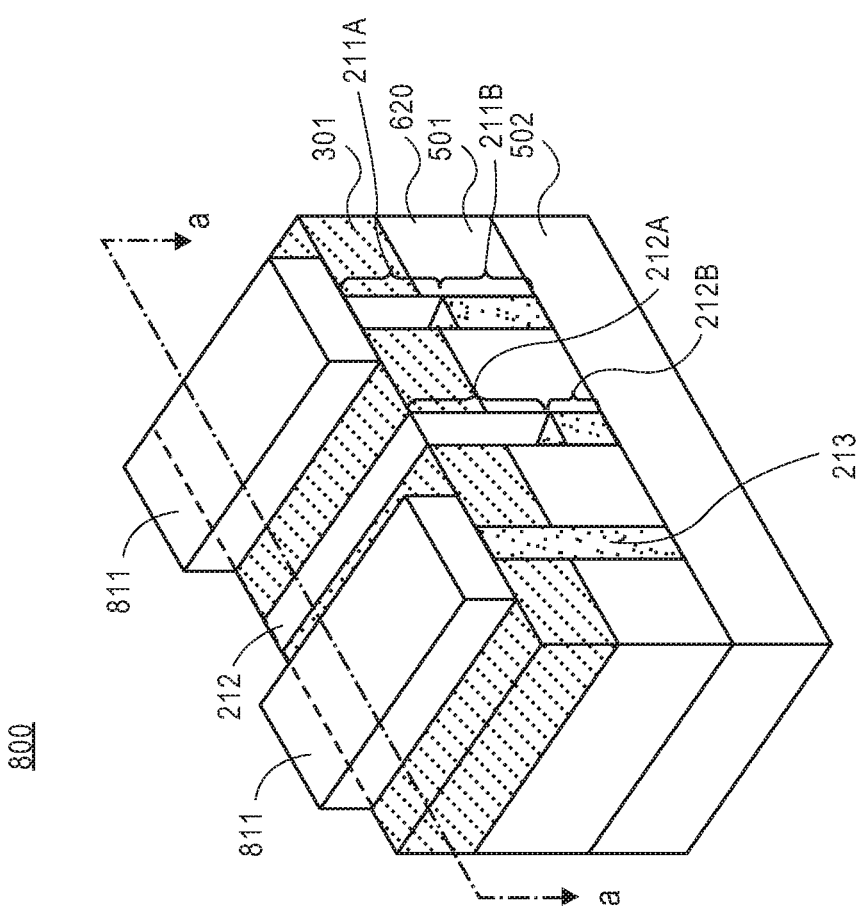
FIG. 8B
FIG. 8A

BACKSIDE FIN RECESS CONTROL WITH MULTI-HSI OPTION

CROSS-REFERENCE TO RELATED APPLICATION

This patent application is a divisional of U.S. patent application Ser. No. 15/752,241, filed Feb. 12, 2018, which is a U.S. National Phase Application under 35 U.S.C. § 371 of International Application No. PCT/US2015/052288, filed Sep. 25, 2015, entitled "BACKSIDE FIN RECESS CONTROL WITH MULTI-HSI OPTION," which designates the United States of America, the entire disclosure of which are hereby incorporated by reference in their entirety and for all purposes.

FIELD OF THE INVENTION

Embodiments of this invention relate to the field of semiconductor devices and more particularly to multi-gate devices.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The further reduction in scale of integrated circuit devices has called for the increased usage of non-planar transistors such as tri-gate transistors, FinFETs, TFETS, omega-FETs, and double-gate transistors. Despite improved performance, drive capability of tri-gate transistors are conventionally sized by the integer number of fins which are placed under the controlling gate. Such a limitation in scalability of tri-gate transistors results in usage of unnecessary larger transistors and increase in power consumption. Therefore, there exists a need for a semiconductor structure and a manufacturing process that enhances the scalability of the tri-gate transistors.

BRIEF DESCRIPTION OF THE DRAWINGS

Embodiments of the present disclosure are illustrated by way of example, and not by way of limitation, in the figures of the accompanying drawings. Various operations in a method of fabricating FinFET devices with multiple active channel heights are illustrated, in accordance with an embodiment of the present invention, where:

FIG. 3C illustrates a perspective view of the semiconductor structure including a first etch stop layer formed within the fin structures, in accordance with an embodiment of the invention.

FIG. 3D illustrates a cross-sectional view of the semiconductor structure illustrated in FIG. 3C along the line a-a', in accordance with an embodiment of the invention.

FIG. 4A illustrates a perspective view of the semiconductor structure including a gate structure formed over the fins and the dielectric layer, in accordance with an embodiment of the invention.

FIG. 4B illustrates a cross-sectional view of the semiconductor structure illustrated in FIG. 4A along the line a-a', in accordance with an embodiment of the invention.

FIG. 6C illustrates a perspective view of the semiconductor structure including a etch stop layer, in accordance with an embodiment of the invention.

FIG. 6D illustrates a cross-sectional view of the semiconductor structure illustrated in FIG. 6C along the line a-a', in accordance with an embodiment of the invention.

FIG. 8A illustrates a perspective view of the semiconductor structure following the formation of the sub-channel region and the active channel region of a second fin, in accordance with an embodiment of the invention.

FIG. 8B illustrates a cross-sectional view of the semiconductor structure illustrated in FIG. 8A along the line a-a', in accordance with an embodiment of the invention.

DETAILED DESCRIPTION

Embodiments of the present invention are directed to formation of fins with different active channel heights in a tri-gate or a Fin-FET device. In the following description, numerous details are set forth in order to provide a thorough understanding of the present invention. It will be apparent, however, to one skilled in the art, that the present invention may be practiced without these specific details. In other instances, well-known semiconductor processes and manufacturing techniques have not been described in detail to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Embodiments of the present invention relate to a method of fabricating a FinFET device including at least two fins. Each fin includes an active channel region and a sub-channel region. The current path through each fin is approximately proportional to twice the height plus the width of the active channel region. In an embodiment, the active channel regions of the fins have different heights. Such embodiments facilitate a better control over the current flow rate of the device. In an embodiment, the desired height of each fin is formed using backside reveal and backside etching process.

In an embodiment, at least two fins are formed on a front side of a substrate. A gate structure extends over a top surface and a pair of sidewalls of at least a portion of the fins. In an embodiment, the substrate is thinned to expose the bottom surface of the fins. Backside etching may be performed on each fin to form the active channel region of the fin. The fins may be recessed to different depths, forming active channel regions with differing heights in a tri-gate or a FinFET device.

In an embodiment, a timed etch is performed to achieve the desired heights for active channel regions. In other embodiments, etch-stop layers are formed within the fin structures to control precise etching of the fins. In an embodiment, the etch-stop layers are epitaxially grown during the formation of the fins on the substrate. In other embodiments, ion impurities are introduced into the fin to form the etch-stop layers.

Figure 1:
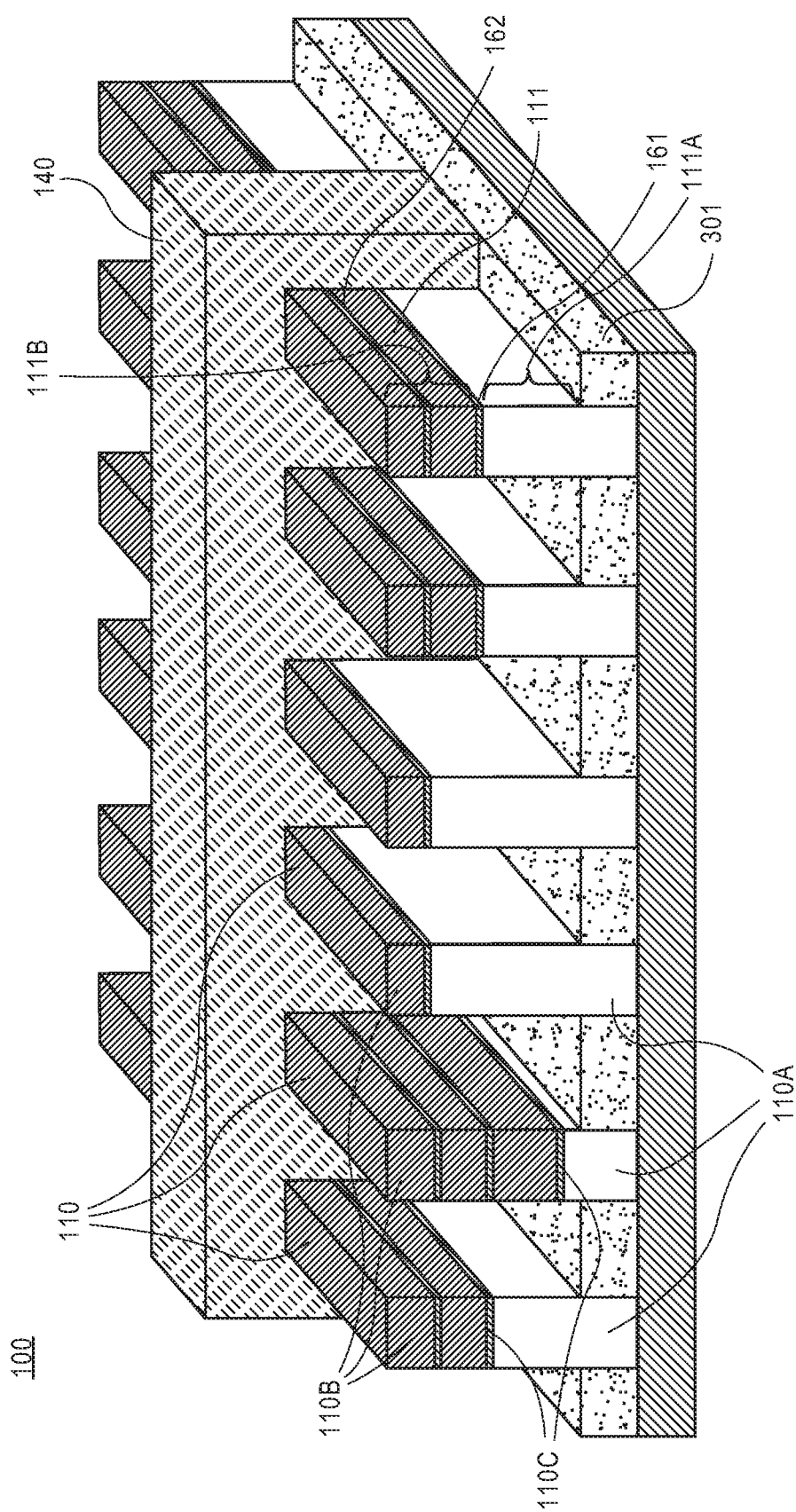
FIG. 1 illustrates a semiconductor structure having a plurality of fins with different active channel heights, in accordance with an embodiment of the invention.

Referring to FIG. 1, a perspective view of a FinFET device including a plurality of fins with different active channel heights is illustrated. In an embodiment, the device 100 includes a plurality of fins 110. Each fin includes an active channel region 110b and a sub-channel region 110a. The height of the fins 110 are defined by the distance between the bottom surface of the sub-channel region 110a to the top surface of the active channel region 110b. In an embodiment, the fins 110 have a same height. An active channel height is defined by the distance between a top surface of the sub-channel region 110a to the top surface of the active channel region 110b. In an embodiment, the fins 110 have differing active channel heights.

In an embodiment, the sub-channel region 110a is composed of dielectric material such as silicon dioxide or a low k dielectric. In an alternative embodiment, the sub-channel region 110a is an air gap. In an embodiment, the active channel regions 110b are composed of semiconductor material such as, but not limited to, silicon, germanium, SiGe, GaAs, InSb, GaP, GaSb, InAlAs, InGaAs, GaSbP, GaAsSb, and InP.

In an embodiment, a dielectric layer 130 is disposed between the fins 110 such that at least a portion of the fins 110 are exposed. In an embodiment, the top surface of the sub-channel region 110a is aligned with the top surface of the dielectric layer 130. In an embodiment, a gate structure 140 is formed over the dielectric layer 130 and the fins 110 in a channel region 450 of the device between the source/drain regions 451. In one embodiment, the gate structure extends over a top surface and a pair of sidewalls of the portion of the fins 110 that are disposed above the dielectric layer 130. In an embodiment, the gate structure covers at least the active channel regions of the fins.

In an embodiment, an etch stop layer 110c is disposed between the active channel region 110b and the sub-channel region 110a of the fins 110. For example, the etch stop layer 161 is disposed between the active channel region 111b and the sub-channel region 111a. In other embodiments, the active channel region 110b may include etch stop layers. For example, the active channel region 111b of the fin 111 includes an etch stop layer 162. In an embodiment, some of the active channel regions of the device may include no etch stop layer while some of the active channel regions may include one or a plurality of etch stop layers.

In an embodiment, the etch stop layer 110c may be composed of a material that illustrates strong etch selectivity with respect to the semiconductor material of the active channel region 111b. In an embodiment, the etch stop layer 110c is an epitaxial layer. In an alternative embodiment, the etch stop layer 110c may be composed of ion impurities. In an embodiment, ion impurities may be selected from the group including, but not limited to, phosphorous (P), arsenic (As), antimony (Sb), boron (B), oxygen (O), carbon (C) and the combinations thereof.

Figure 2B:
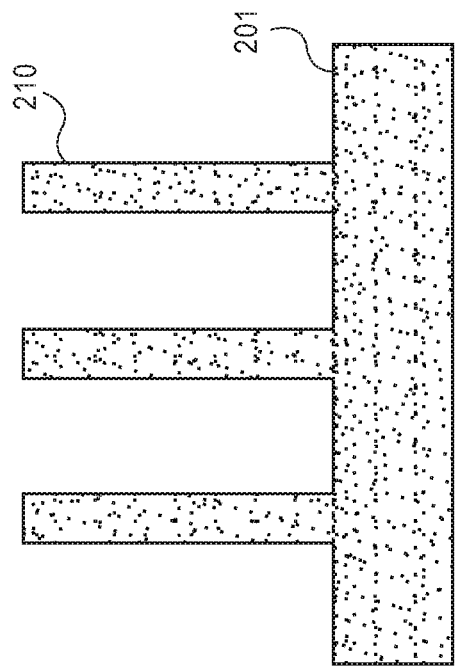
FIG. 2B illustrates a cross-sectional view of the semiconductor structure illustrated in FIG. 2A along the line a-a', in accordance with an embodiment of the invention.
Figure 2A:
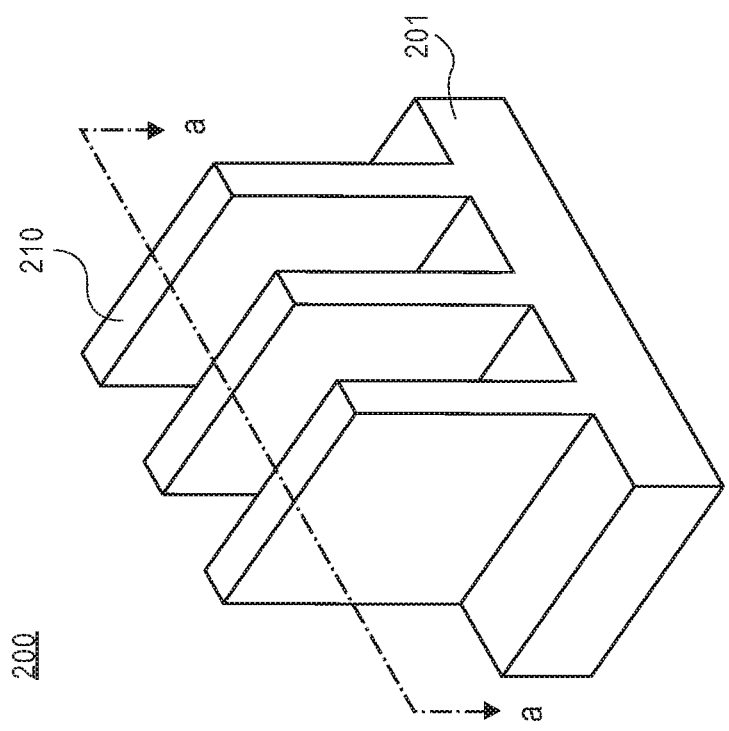
FIG. 2A illustrates a perspective view of the semiconductor structure including a substrate and a plurality of fins formed on the front side of the structure, in accordance with an embodiment of the invention.

FIGS. 2A-9C illustrate methods for forming fins with different active channel heights in a tri-gate or a Fin-FET device. Referring to FIG. 2A, a perspective view of the structure 200 including a substrate 201 and a plurality of fins 210 formed on a front side of the structure 200 is illustrated. FIG. 2B is a cross-sectional view of the structure 200 taken along the line a-a' of FIG. 2A. The number of fins 210 formed on the substrate 201 can be adjusted to an appropriate number, as it is understood to those skilled in the art. In an embodiment, at least two fins are formed on the substrate 201. In an embodiment, the fins 210 are formed using an etching process. A patterning etch mask is placed on the substrate 201. Thereafter, the substrate 201 is etched and the portions of the substrate protected by the mask form the fins 210. The etch masks are then removed.

In an embodiment, the substrate 201 may be composed of any suitable material for semiconductor device fabrication. In an embodiment, the substrate 201 may be a crystalline substrate formed using a bulk silicon. In an embodiment, the fins 210 are formed from the same material as the substrate 201. In other embodiments, the semiconductor substrate 201 may be formed from different material as the fins 210. In an embodiment, the fins 210 are made from silicon. In an embodiment, the substrate 201 may be formed using alternative materials. Such materials may include, but are not limited to, germanium, silicon germanium, indium antimonide, lead telluride, indium arsenide, indium phosphide, gallium arsenide, indium gallium arsenide, gallium antimonide, or other combinations of group III-V or group IV materials. Although a few examples of materials from which the substrate 201 may be formed are described here, any material that may serve as a foundation upon which a semiconductor device may be built falls within the spirit and scope of the present invention.

In an embodiment, the fins 210 are high aspect ratio fins. In an embodiment, the high aspect ratio fins may have a height to width ratio that is 2:1, or greater. An additional embodiment may include the fins 210 that have a height to width ratio that is 10:1, or greater. By way of example the width of the fins 210 may be between 10-20 nm. A representative length range of the fins 210 is on the order of 10 nanometers (nm) to 1 millimeter (mm), and a representative height range is on the order of 5 nm to 200 nm. As illustrated, the fins 210 are three-dimensional body extending on the front surface of the device. It is appreciated that in processing of such bodies, a true rectangular form may not be achievable with available tooling, and other shapes may result. Representative shapes include, but are not limited to, a trapezoidal shape (e.g., base wider than top) and an arch shape.

In an embodiment of the invention, the devices are formed without the formation of etch stop layers. FIGS. 2A and 2B explain the method of forming fin structures without etch stop layers. In other embodiments, etch stop layers are formed within the fin structures. The etch stop layers may be formed at different stages of the process. In an embodiment, the etch stop layers are formed during the formation of the fins as explained with respect to FIGS. 2C and 2D. The etch stop layers can be used to reduce undesirable over-etching of the fins in the subsequent steps. In such an embodiment, the sub-channel region of the fins may be selectively etched with respect to the etch stop layers. The remaining unetched portion of the fin, above the etch stop layer, forms the active channel region of the fin structure.

Figure 2C:
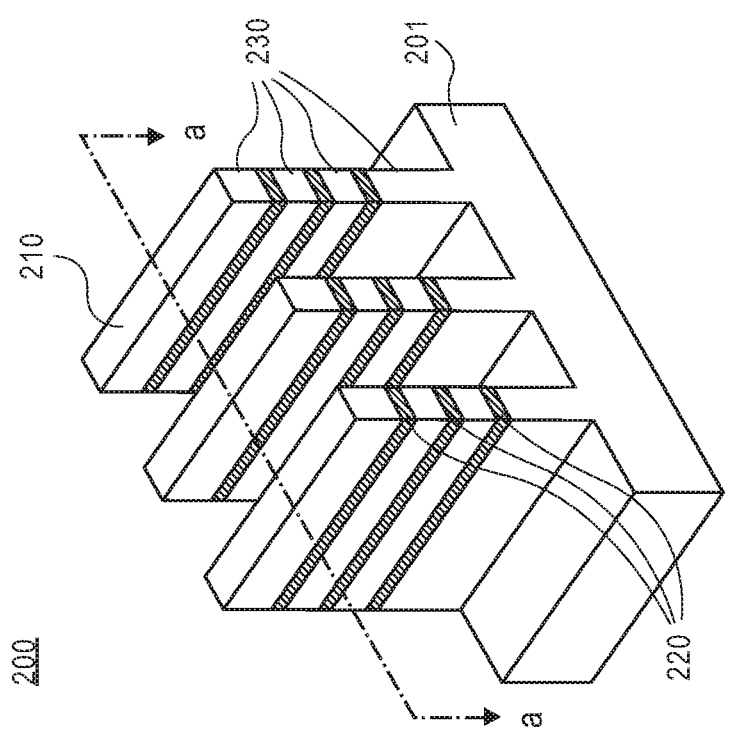
FIG. 2C illustrates a perspective view of the semiconductor structure including fins with etch stop layers, in accordance with an embodiment of the invention.
Figure 2D:
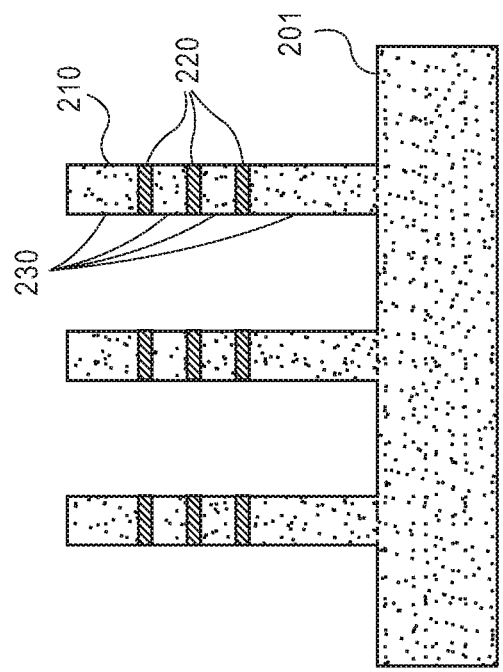
FIG. 2D illustrates a cross-sectional view of the semiconductor structure illustrated in FIG. 2C along the line a-a', in accordance with an embodiment of the invention.

Referring to FIG. 2C, a perspective view of the structure 200 including the fins 210 with etch stop layers 220 is illustrated. FIG. 2D is a cross-sectional view of the structure 300 taken along the line a-a' of FIG. 2C. Elements that are the same as or similar to the components described above in conjunction with the previous embodiment are designated with the same reference numerals. Also, for the sake of clarity and brevity, a detailed discussion of such components and the method of their formation will not be repeated. In one embodiment, the fins 210 include a single etch stop layer. In an alternative embodiment, the fins 210 are formed having a plurality of alternating layers of semiconductor material 230 and etch stop material 220. The plurality of etch stop layers facilitates formation of the fins with different channel height in a tri-gate or FinFET device.

In an embodiment of the invention, the fins 210 are formed by first blanket depositing an alternating layers of semiconductor material 230 and etch stop material 220 on the top surface of the substrate 201. The alternating layers may be deposited using conventional epitaxial chemical vapor deposition methods or via other deposition process (e.g., ALD, PECVD, PVD, HDP assisted CVD, and low temp CVD). Next, the blanket layers of semiconductor material 230 and etch stop material 220 are patterned using conventional photolithography and etching methods to define the fins 210.

In an embodiment, the etch stop material 220 may be chosen based on their etch selectivity to the semiconductor material 230. The etch stop layers 220 may also induce lattice stress on the semiconductor layers 230 by having lattice constant mismatched with respect to the semiconductor layers 230. In an embodiment, the semiconductor layers 230 and the etch stop layers 220 are formed from a single crystalline semiconductor material such as, but not limited to Si, Ge, SiGe, GaAs, InSb, GaP, GaSb, InAlAs, InGaAs, GaSbP, GaAsSb and InP. For example, the semiconductor layers 230 may be silicon and the etch stop layers 220 may be silicon germanium.

Figure 3B:
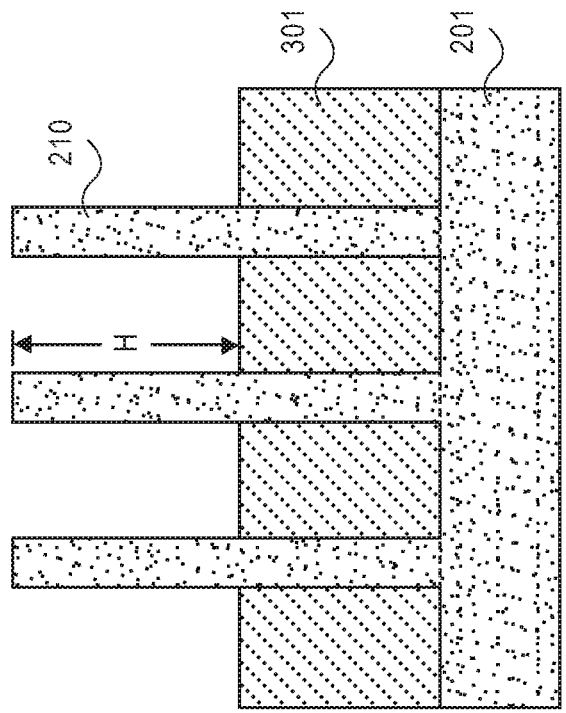
FIG. 3B illustrates a cross-sectional view of the semiconductor structure illustrated in FIG. 3A along the line a-a', in accordance with an embodiment of the invention.
Figure 3A:
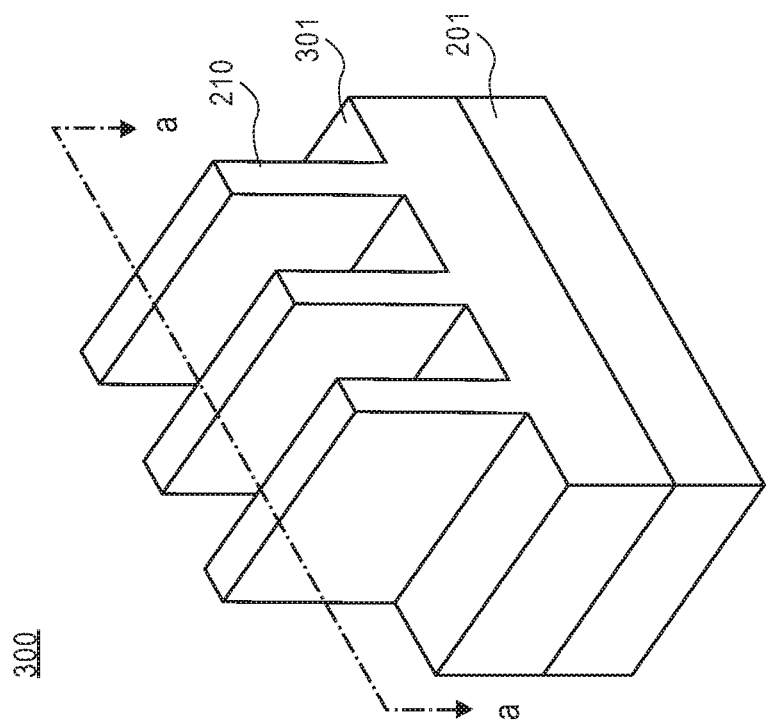
FIG. 3A illustrates a perspective view of the semiconductor structure including a dielectric layer formed over the front side of the substrate, in accordance with an embodiment of the invention.

Referring to FIG. 3A, a perspective view of the structure 300 including a dielectric layer 301 formed over the front surface of the substrate 201 is illustrated. FIG. 3B is a cross-sectional view of the structure 300 taken along the line a-a' of FIG. 3A. In an embodiment, the dielectric layer 301 is disposed over the front surface of the substrate 201 and between the fins 210 such that at least a portion of the fins 210 are exposed.

The dielectric layer 301 may be deposited by a chemical vapor deposition (CVD) or other deposition process (e.g., ALD, PECVD, PVD, HDP assisted CVD, low temp CVD). The dielectric layer 301 may be deposited to a height above a top surface of the fins 210. Then, the dielectric layer 301 is planarized to expose the top surface of the fins 101. For example, dielectric layer 301 may be planarized with a chemical-mechanical polishing (CMP) operation. Subsequently, the dielectric layer 301 is recessed to expose protruding portions of the fins 210. The recessing of the dielectric layer 301 may be performed by a plasma, vapor or wet etch process. In one embodiment, conventional processes may be used to recess or etch the dielectric layer 301, including but not limited to, wet etching processes using hydrogen fluoride (HF) or dry etching processes using CHF3, CH3F, or CF4. In further implementations, other wet or dry etching processes may be used. In one embodiment, an etching process that is selective to silicon fins is used.

In an embodiment, the dielectric layer 301 may be formed from any appropriate insulating material. For example, the dielectric layer 301 may be an oxide, such as a silicon oxide. According to an additional embodiment, the dielectric layer 301 may include a plurality of dielectric materials. For example, a first dielectric material may be a conformal material and a second dielectric material may be a fill material.

In an alternative embodiment, etch stop layers are formed within the fins at this stage of the process. Formation of the etch stop layers at this stage of the process are explained with respect to FIG. 3C-3F. Elements that are the same as or similar to the components described above in conjunction with the previous embodiment are designated with the same reference numerals. Also, for the sake of clarity and brevity, a detailed discussion of such components and the method of their formation will not be repeated.

Referring to FIG. 3C, a perspective view of the structure 300 is shown including a first etch stop layer 321 formed within the fins 210. FIG. 3D is a cross-sectional view of the structure 300 taken along the line a-a' of FIG. 3C. In an embodiment, the dielectric layer 301 is recessed to an initial depth of $H_1$ according to the depositing and recessing methods describe in details with respect to FIGS. 3A and 3B. Height $H_1$ defines the height of the exposed portion of the fins 210 and subsequently the first height of the active channel region of the fin structures. In an embodiment, the first etch stop layer 321 may be formed by introducing an abrupt impurity profile to the portion of the fin that is adjacent to the top surface of the dielectric layer 301.

In an embodiment of the invention, the top surface of dielectric layer 301 is implanted with ion impurities. The front side ion implantation of the device forms an impurity region 311 on the top surface of the dielectric layer 301. Upon contact with the top surface of the dielectric layer 301, ion impurities may spread laterally into the adjacent portion of the fins 210. As such, an abrupt impurity profile is introduced into the fins to form the first etch stop layer 321 within the fin structure. In an embodiment, the introduction of ion impurities to the fin results in an etch selectivity of the first etch stop layer 321 with respect to the rest of the fin structure. In an embodiment, the thickness, ion type, and ion concentration of the impurity region 311 is selected to form a suitable etch stop layer within the fins 210.

In an embodiment of the invention, impurity ions may be selected from the group including, but not limited to, phosphorous, arsenic, antimony, boron and the combinations thereof. In a specific embodiment, the fins may be silicon and the impurity ion may be germanium, boron, carbon, arsenic, phosphorus or oxygen. In an embodiment, the first etch stop layer 321 has a thickness of 5-100 nm. The impurity ions are implanted into front surface of the device as indicated by arrows in FIGS. 3C and 3D. In an embodiment, a vertical implantation is performed by injecting ions to enter the surface of the dielectric layer 301, such that the angle of incidence is substantially orthogonal to the front surface of the device. In an embodiment, the vertical implantation of impurity ions prevents introduction of impurities into the active channel region of the fins. In an embodiment, a hardmask 350 is formed on the top surface of the fin to further prevent entering of ion impurities to the active channel region of the fins. In an embodiment, the ion energy used for ion implantation is a very low ion energy level, for example ion energy level may be within a range of 2-30 KeV. The ion energy may depend on ion mass of the impurity materials. For example, lighter ions such as boron may be implanted at lower energies and heavier ions such as arsenic may be implanted at higher energies.

In an embodiment of the invention, a single etch stop layer is created within the fin structure. The single etch stop layer facilitates formation of one active channel region above the etch stop layer. Subsequently, a gate structure may be formed on top of the dielectric layer as described below with respect to FIGS. 4A and 4B. In such an embodiment, ion implantation of the top surface of the dielectric layer facilitates formation of a self-aligned active channel region with respect to the gate structure. In an alternative embodiments, multiple etch stop layers may be formed to create fins with different active channel heights in a tri-gate or a FinFET device.

Figure 3F:
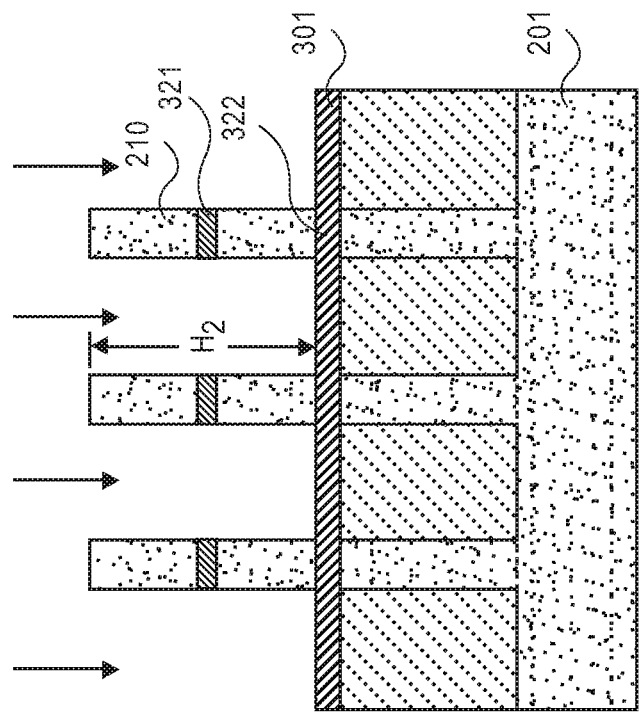
FIG. 3F illustrates a cross-sectional view of the semiconductor structure illustrated in FIG. 3E along the line a-a', in accordance with an embodiment of the invention.
Figure 3E:
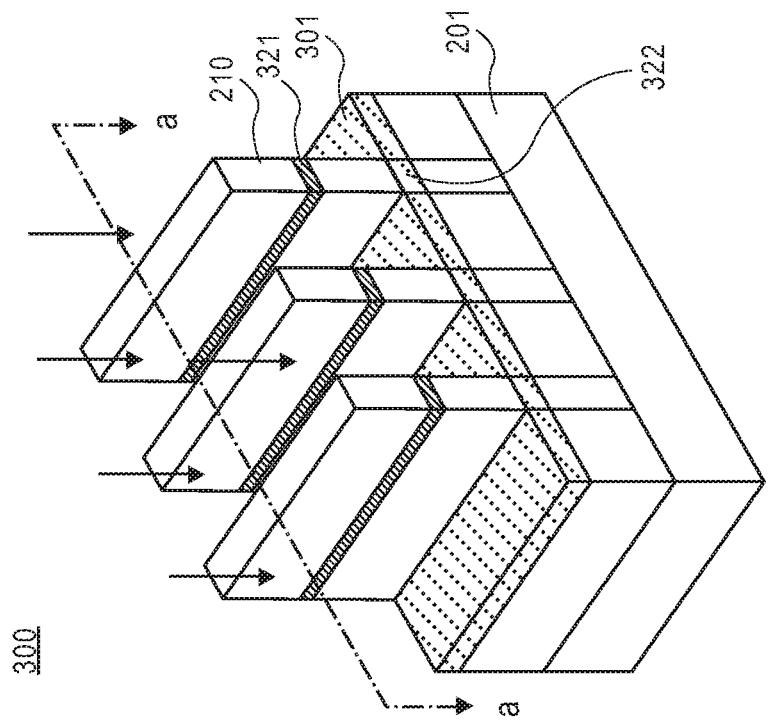
FIG. 3E illustrates a perspective view of the semiconductor structure including a second etch stop layer, in accordance with an embodiment of the invention.

Referring to FIG. 3E, a perspective view of the structure 300 including a second etch stop layer 322 is shown. FIG. 3F is a cross-sectional view of the structure 300 taken along the line a-a' of FIG. 3E. Elements that are the same as or similar to the components described above in conjunction with the previous embodiment are designated with the same reference numerals. Also, for the sake of clarity and brevity, a detailed discussion of such components and the method of their formation will not be repeated.

In an embodiment of the invention, the dielectric layer 301 is recessed further to expose a lower region of the fins below the first etch stop layer 321. Height $H_2$ defines the height of the exposed portion of the fins 210 and subsequently a second height of the active channel region of the fin structures. In an embodiment, the top surface of dielectric layer 301 is implanted by ion impurities to form the second etch stop layer 322 below the first etch stop layer 321. The process of forming an etch stop layer within the fins by ion implantation is explained in details with respect to FIGS. 3C and 3D above and hence is not discussed again to avoid repetition.

It is appreciated that additional etch stop layers may be formed within the fin structure below the second etch stop layer 322 by repeating the recessing dielectric layer and ion implantation process explained above with respect to FIGS. 3C-3F. Formation of the plurality of etch stop layers within the fins facilitates creation of fins with different channel heights in a tri-gate or a FinFET device as explained further below, in accordance with an embodiment of the invention. Subsequently, a gate structure may be formed on top of the dielectric layer as described below with respect to FIGS. 4A and 4B. In such an embodiment, ion implantation of the top surface of the recessed dielectric layer facilitates formation of a self-aligned active channel region with respect to the gate structure.

Referring to FIG. 4A, a perspective view of the structure 400 including a gate structure 410 formed over the fins 210 and the dielectric layer 301 is illustrated. FIG. 4B is a cross-sectional view of the structure 400 taken along the line a-a' of FIG. 4A. In one embodiment, the gate structure 410 surrounds at least a top surface and a pair of sidewalls of the portion of the fins 210 that are above the dielectric layer 301. The gate structure 410 includes the gate electrode 411 and the gate dielectric layer 412. In an embodiment, the gate structure 410 may further include a pair of sidewall spacers 413 on either sides of the gate structure 410.

The gate structure 410 may be composed of a gate electrode stack, which includes the gate dielectric layer 412 and the gate electrode layer 411. In an embodiment, the gate electrode layer 411 of the gate electrode stack is composed of a metal gate and the gate dielectric layer 412 is composed of a high-K material. For example, in one embodiment, the gate dielectric layer 412 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode layer 411 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer 411 is composed of a non-workfunction-setting fill material formed above a metal workfunction-setting layer.

Furthermore, the gate structure 410 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide (TMAH). In one embodiment, dummy gates are composed of silicon nitride and are removed with a wet etch including aqueous phosphoric acid.

In an embodiment, after the formation of the gate structure 410, an inter-layer dielectric (ILD) layer 501 is blanket deposited over the exposed surfaces on front side of the device. The ILD layer 501 may be deposited using a conventional technique, such as CVD. In an embodiment, the ILD layer 501 may be any dielectric material such as, but not limited to undoped silicon oxide, doped silicon oxide (e.g., BPSG, PSG), silicon nitride, and silicon oxynitride. After the ILD layer 501 is deposited, any overburden may then be polished back using a conventional chemical mechanical planarization method to expose a top surface of the gate structure 410.

Figure 5B:
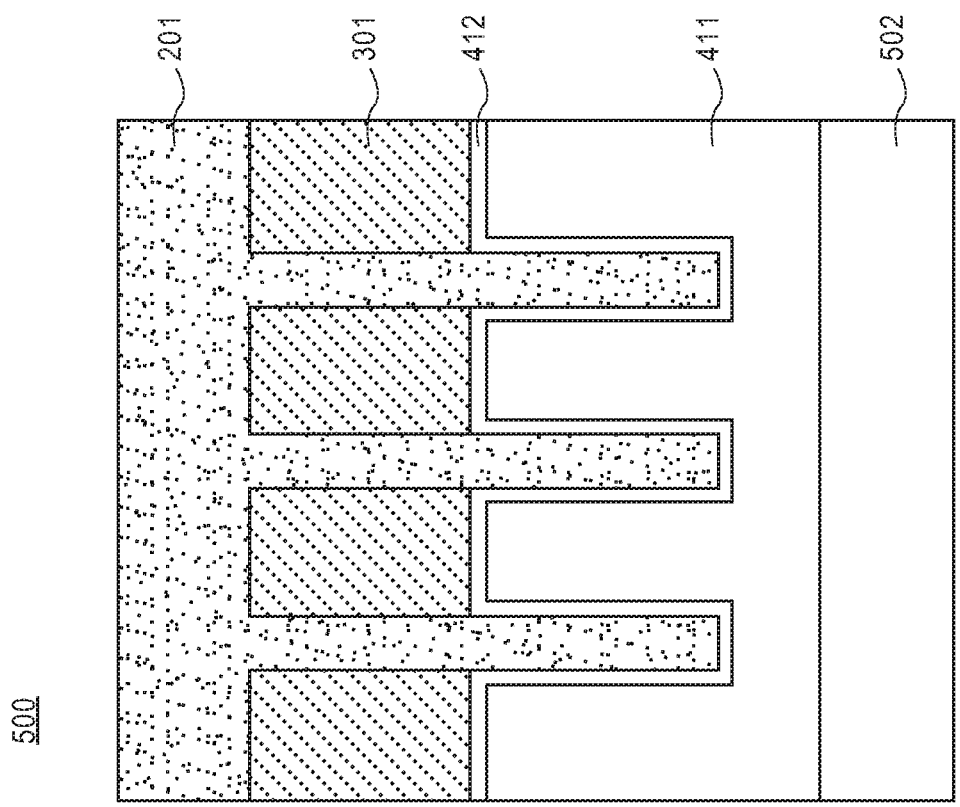
FIG. 5B illustrates a cross-sectional view of the semiconductor structure illustrated in FIG. 5A along the line a-a', in accordance with an embodiment of the invention.
Figure 5A:
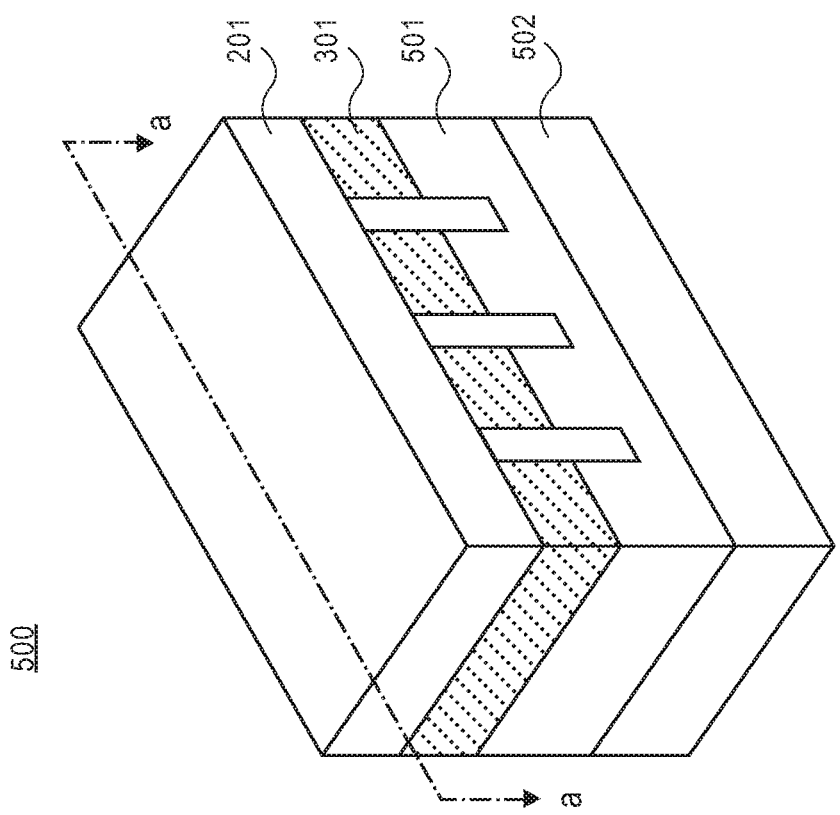
FIG. 5A illustrates a perspective view of the semiconductor structure following the flipping of the structure and connecting the structure to a carrier, in accordance with an embodiment of the invention.

Referring to FIG. 5A, a perspective view of the structure 500 following the inverting or flipping of the structure and connecting the structure to a carrier 502 is illustrated. FIG. 5B is a cross-sectional view of the structure 400 taken along the line a-a' of FIG. 5A. In an embodiment, after the formation of the gate structure 410 and the ILD layer 501, the structure is connected to the carrier 502 and flipped. In an embodiment, the structure 500 is inverted such that the front side of the structure 500 faces down and the backside of the structure 500 faces up. The structure is then connected to the carrier 502. The carrier 502 is the base that provides support to the device while it is processed. For example, the carrier 502 may be a semiconductor wafer. The structure 500 may be connected to the carrier 502 through an adhesive or other bonding techniques.

Figure 6B:
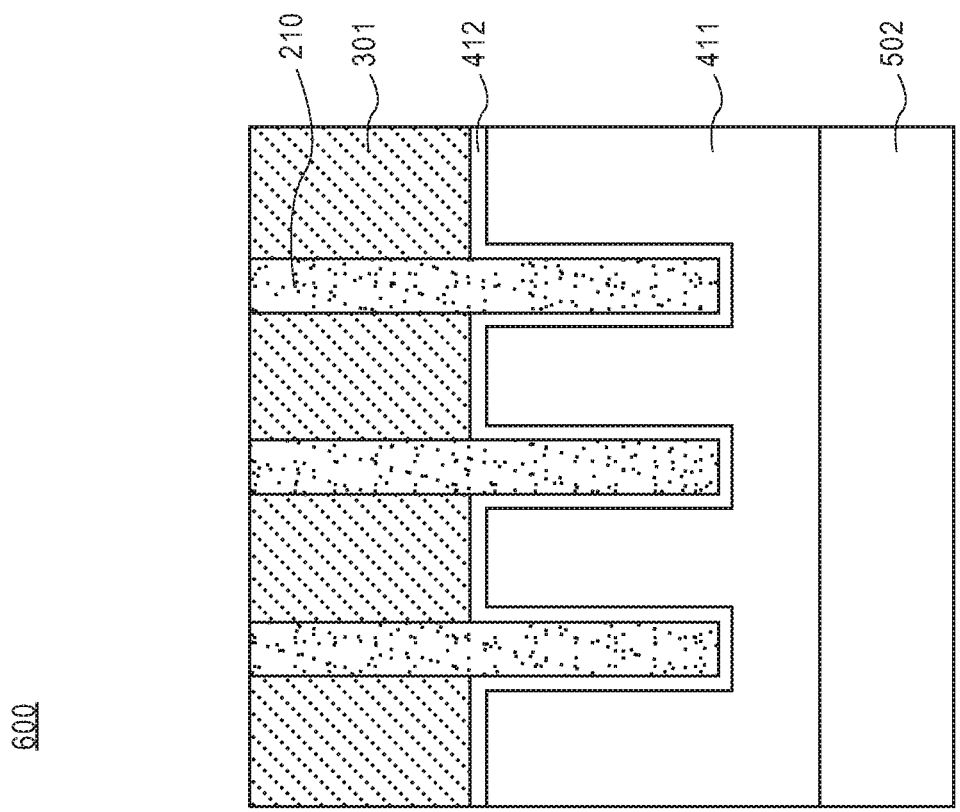
FIG. 6B illustrates a cross-sectional view of the semiconductor structure illustrated in FIG. 6A along the line a-a', in accordance with an embodiment of the invention.
Figure 6A:
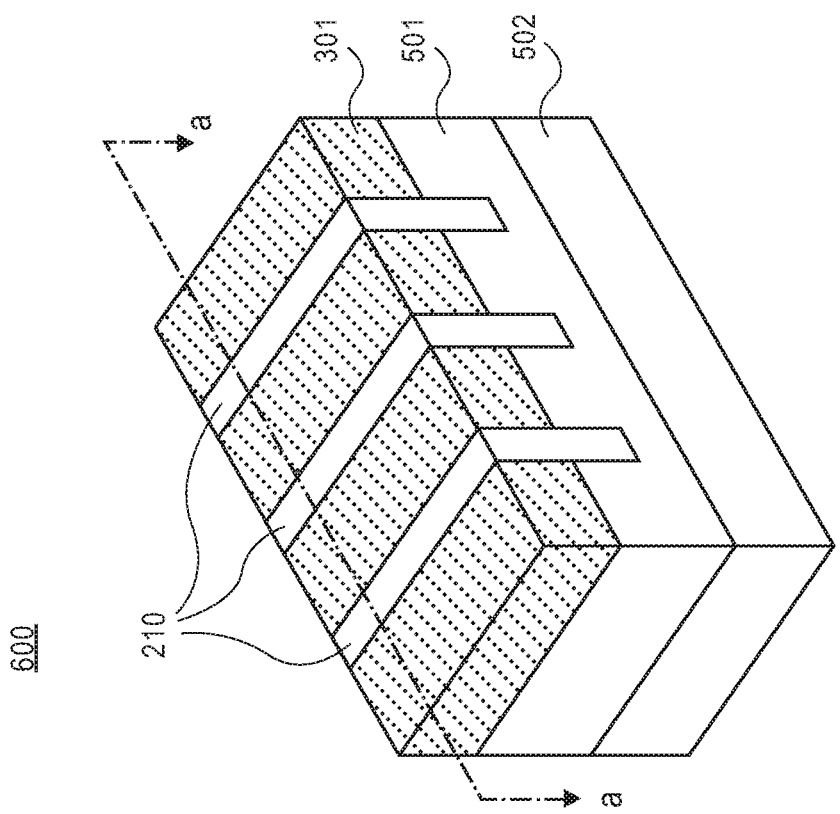
FIG. 6A illustrates a perspective view of the semiconductor structure following the removal of the substrate, in accordance with an embodiment of the invention.

Referring to FIG. 6A, a perspective view of the structure 600 following the removal of the substrate is illustrated. FIG. 6B is a cross-sectional view of the structure 600 taken along the line a-a' of FIG. 6A. The structure 600 is thinned from the backside to expose the bottom surface of fins 210. The thinning step can be performed using a mechanical planarization apparatus (e.g., a grinder). In an embodiment, the thinning step can also be performed using a chemical mechanical planarization (CMP) apparatus. In alternative embodiments, the thinning step may be performed using a back etch process, such as a wet etch process, a dry etch process or a plasma etching process.

Referring to FIG. 6C, a perspective view of the structure 600 including an etch stop layer 620 is shown. FIG. 6D is a cross-sectional view of the structure 600 taken along the line a-a' of FIG. 6C. Elements that are the same as or similar to the components described above in conjunction with the previous embodiment are designated with the same reference numerals. Also, for the sake of clarity and brevity, a detailed discussion of such components and the method of their formation will not be repeated.

In an embodiment of the invention, an etch stop layer is formed following the removal of the substrate 201. In an embodiment, the etch stop layer 620 is formed by a backside ion implantation process. In an embodiment, ion impurities may be introduced into the device to form an impurity region 620 within the device. The impurity region 620 may be formed across the gate structure 410 (including gate electrode 411 and gate dielectric 412), the ILD layer 501, and the fins 210. The portion of the impurity region 620 formed within the fins 210 defines the etch stop layer 621. The depth at which the impurity region 620 is formed may depend on the ion type, implantation energy (acceleration voltage), composition of target material, crystal orientation of substrate, prior crystal damage to the substrate, temperature of ion implant, and angle of implantation. In an embodiment, the height H of the active channel region of each fin is defined by the distance between the top surface of the etch stop layer 620 and the top surface of the fins 211.

In an embodiment of the invention, the impurity ions may be selected from the group including, but not limited to, phosphorous (P), arsenic (As), antimony (Sb), boron (B) and the combinations thereof. In a specific embodiment, the fins may be silicon and the impurity ion may be germanium, boron, carbon, arsenic, phosphorus or oxygen. The impurity ions are implanted into the back surface of the device as indicated by arrows in FIGS. 6C and 6D. In an embodiment, a vertical implantation is performed by injecting ions to enter the back surface of the dielectric layer 301 and the fins 210, such that the angle of incidence is substantially orthogonal to the back surface of the device. In an embodiment, the ion energy for ion implantation is a very low ion energy level, for example in a range of 10-30 KeV.

Figure 7A:
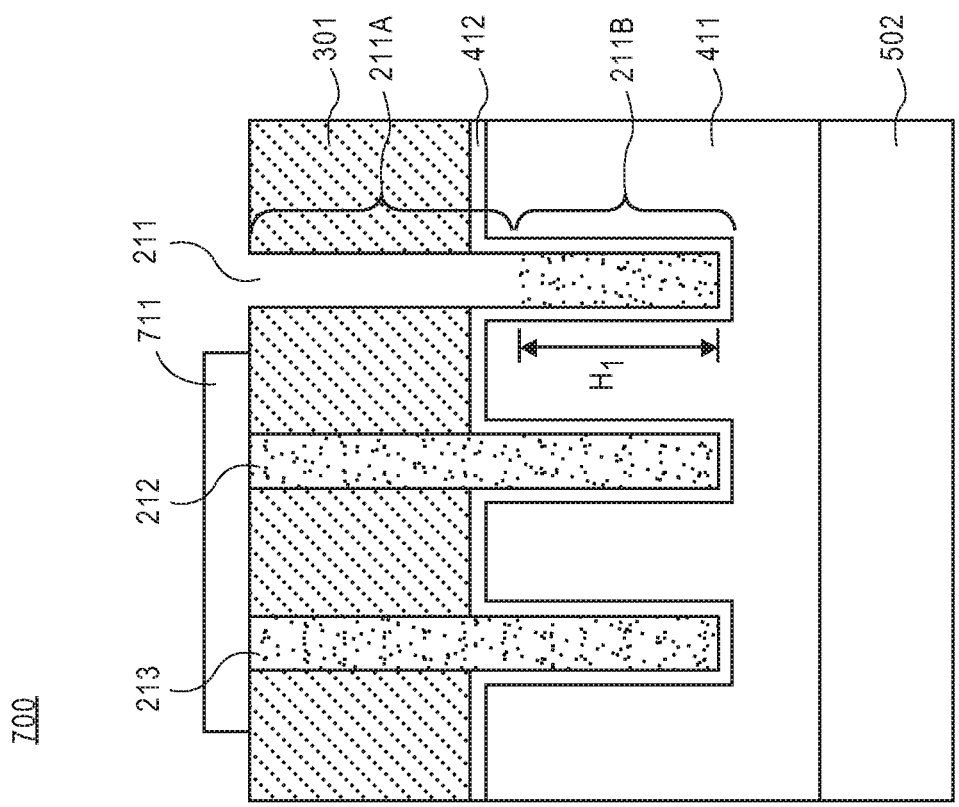
FIG. 7A illustrates a perspective view of the semiconductor structure following the formation of the sub-channel region and the active channel region of a first fin, in accordance with an embodiment of the invention.
Figure 7B:
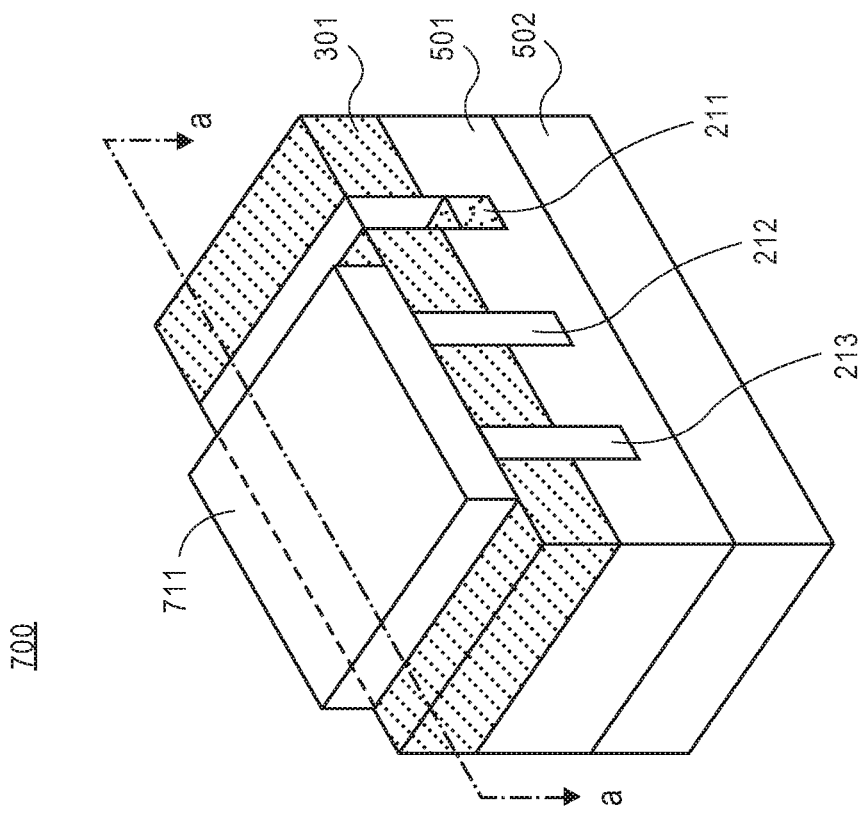
FIG. 7B illustrates a cross-sectional view of the semiconductor structure illustrated in FIG. 7A along the line a-a', in accordance with an embodiment of the invention.

Referring to FIG. 7A, a perspective view of the structure 700 is shown following the formation of the sub-channel region and the active channel region of fin 211. FIG. 7B is a cross-sectional view of the structure 700 taken along the line a-a' of FIG. 7A. In an embodiment, a sub-channel region 211a is formed by recessing the fin from backside. In an embodiment, the remaining portion of the fin after the recess forms the active channel region 211b of the fin 211.

In an embodiment, a first hard mask layer 711 is blanket deposited over the exposed backside surfaces of the dielectric layer 301 and the fins 210 (including fin 211, fin 212, and fin 213). In an embodiment, the first hard mask layer 711 is a material resistant to the etch process used to etch the sub-channel region 211a of the fin 211. In some embodiments, the first hard mask layer 711 has an etch rate slower than the dielectric layer 301 with respect to selected etchant. In an embodiment, the first hard mask layer 711 is silicon dioxide or a high k metal oxide dielectric, such as titanium oxide, hafnium oxide, or aluminum oxide. In an embodiment, the first hard mask layer 711 may comprise a silicon nitride material with various amounts of oxygen and/or carbon present to modulate the etch rate. The first hard mask layer 711 may be 1 to 10 nm thick. The first hard mask layer 711 may be formed by any suitable process, such as chemical vapor deposition (CVD), physical vapor deposition (PVD) or atomic layer deposition (ALD).

In an embodiment, the first hard mask layer 711 is then patterned as illustrated in FIGS. 7A and 7B to form a mask covering the fins 212 and 213 while exposing the bottom surface of the fin 211. In an embodiment, the first hard mask layer 711 protects the underlying fins 212 and 213 from the etching to come. The first hard mask layer 711 may be patterned using any suitable techniques such as photolithography, as is well known in the art.

Next, the exposed backside surface of the fin 211 is etched to remove the sub-channel region 211a of the fin structure. The depth of the recess corresponds to height $H_1$ of the active channel region 211b of the fin 211. In an embodiment, at least a portion of the fin that is not surrounded by the gate structure 410 is removed. In other embodiments, the etching process removes a portion of the fin 211 that is surrounded by the gate structure 410.

In an embodiment, backside etching may be a timed-etch process. The time duration of backside etching corresponds with the consumption amount of the sub-channel region 211a. In an embodiment, the time duration is selected such that the backside etching is stopped when the desired height $H_1$ of active channel region 211b is reached.

In an embodiment, different etchants are used, selected based on the etch selectivity to etch sub-channel region 211a of fin 211 while leaving dielectric layer 301 substantially intact. In an embodiment where first hard mask layer 711 includes a silicon nitride material, the dielectric layer 301 includes a silicon oxide material, and the sub-channel region 211a includes silicon, the etching may use gasses like Cl, HBr, and $SF_6$ for dry etch, a wet etch with TMAH, or a vapor etch with TMAH. Other combinations may also be used.

Subsequently, the first hard mask layer 711 may be removed by any suitable technique, such as a resist strip.

Referring to FIG. 8A, a perspective view of the structure 800 is shown following the formation of a sub-channel region 212a and an active channel region 212b of a second fin 212. FIG. 8B is a cross-sectional view of the structure 800 taken along the line a-a' of FIG. 8A. In an embodiment, the sub-channel region 212a is formed by recessing the fin 212 from the backside. In an embodiment, the remaining portion of the fin structure after the recess forms the active channel region 212b of the second fin 212. In an embodiment, the height $H_2$ of the active channel region 212b is different than the height $H_1$ of the active channel region 211b.

In an embodiment, second hard mask layer 811 is blanket deposited over the exposed backside surface of the dielectric layer 301 and the fins 210. In an embodiment, the second hard mask layer 811 is then patterned as illustrated in FIGS. 8A and 8B to form a mask covering the fins 211 and 213 while exposing the bottom surface of the fin 212. In an embodiment, the second hard mask layer 811 protects the underlying fins 211 and 213 from the etching to come. In an embodiment, the second hard mask layer 811 does not cover the fin 211, as subsequent etching may be calculated in the overall desired height of the active channel region 211b. The process of depositing and patterning hard mask layer is explained in details with respect to FIGS. 7A and 7B above and hence is not discussed again to avoid repetition.

Next, the exposed backside surface of the fin 212 is etched to remove the sub-channel region 212a. The depth of the recess corresponds to height $H_2$ of active channel region 212b of fin 211. In an embodiment, at least the portion of the fin that is not surrounded by the gate structure 410 is removed. In other embodiments, the etching process removes a portion of the fin 212 that is surrounded by the gate structure 410.

In an embodiment, backside etching may be a timed-etch process. The time duration of backside etching corresponds with the consumption amount of the sub-channel region 212a. In an embodiment, the time duration is selected such that the backside etching is stopped when the desired height $H_2$ of the active channel region 212b is reached. Subsequently, the second hard mask layer 811 may be removed by any suitable technique, such as a resist strip. The process of etching the sub-channel region is explained in details with respect to FIGS. 7A and 7B above and hence is not discussed again to avoid repetition.

In an embodiment, the process of backside etching explained above with respect to FIGS. 7A-8B may be repeated for other fins to form multiple active channel regions with differing heights in a FinFET or a tri-gate device.

Figure 8D:
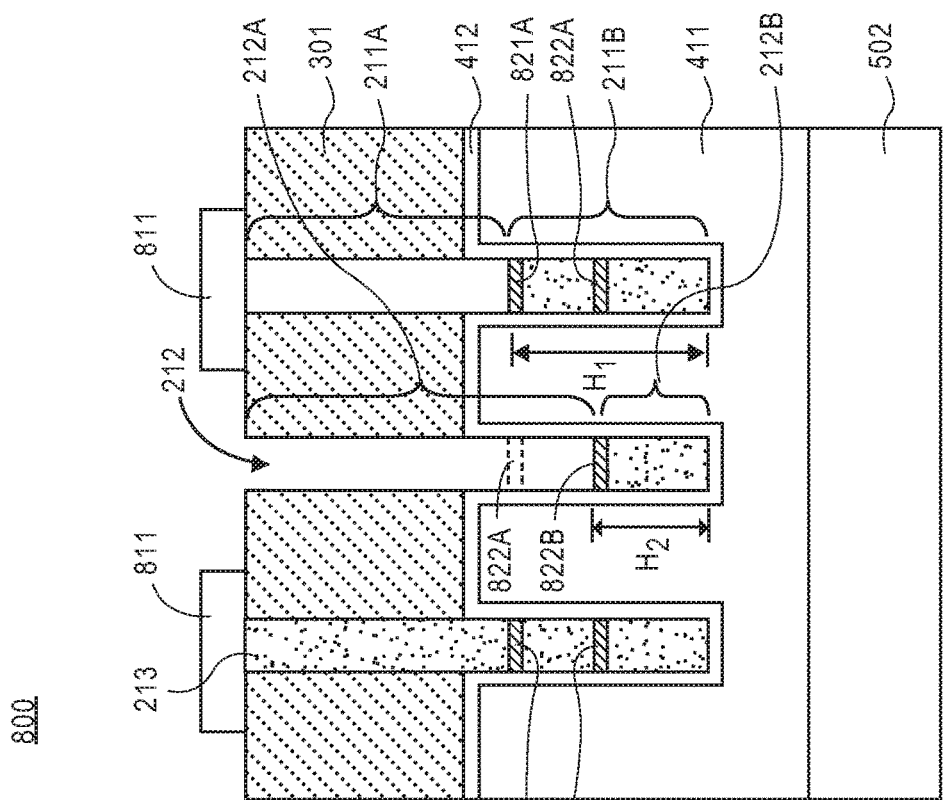
FIG. 8D illustrates a cross-sectional view of the semiconductor structure illustrated in FIG. 8C along the line a-a', in accordance with an embodiment of the invention.
Figure 8C:
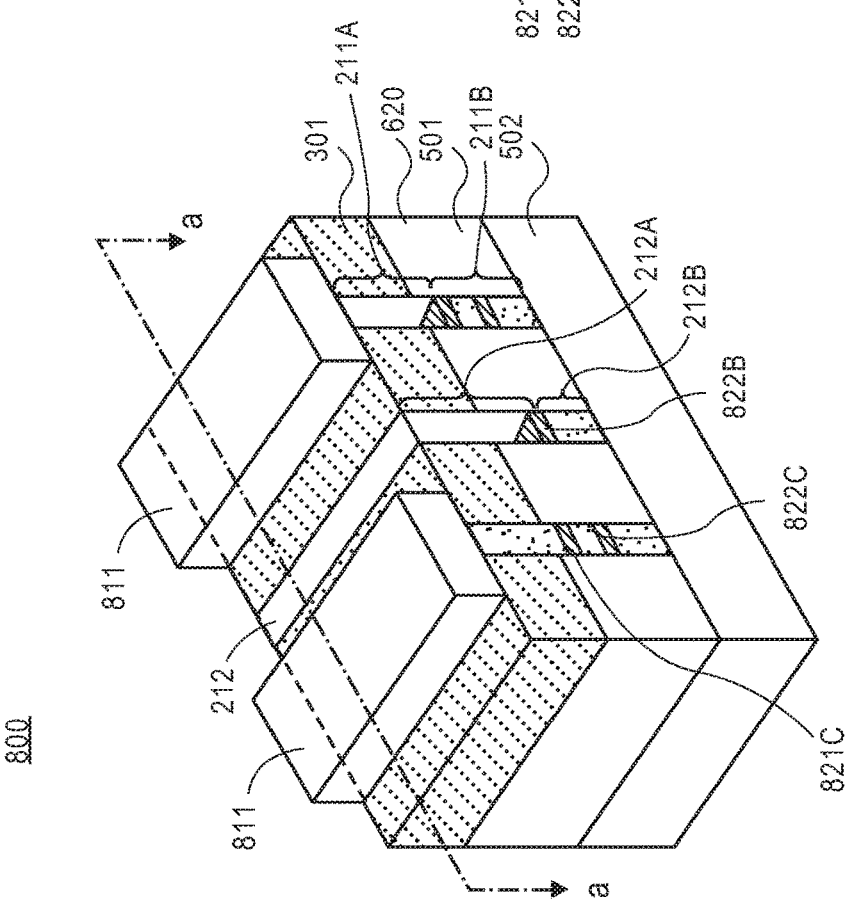
FIG. 8C illustrates a perspective view of the semiconductor structure following the formation of active channel regions below the etch stop layers of fins, in accordance with an embodiment of the invention.

In an embodiment of the invention, timed etching is used to recess the sub-channel region of the fin to an appropriate depth. FIGS. 7A-8B describe the formation of active channel regions without usage of etch stop layers. In other embodiments, etch stop layers are formed within the fins according to the previously disclosed methods. A fin may include a single or multiple etch stop layers formed at different heights within the fin. The etch stop layers may facilitate a more precise control over the backside etching process of the device. The etch stop layers can be used to reduce undesirable over-etching of the fins. FIGS. 8C and 8D describe the formation of the active channel regions using etch stop layers.

Referring to FIG. 8C, a perspective view of the structure 800 is shown following the formation of active channel regions below the etch stop layers of fins 210. FIG. 8D is a cross-sectional view of the structure 800 taken along the line a-a' of FIG. 8C. In an embodiment, the etch stop layers may be formed prior to backside etching in accordance with one of the previously disclosed methods. In an embodiment, each fin may include only one etch stop layer. In other embodiments, a plurality of etch stop layers are formed within each fin. Referring to FIGS. 8C and 8D, a plurality of etch stop layers 821 and 822 are formed within the fins 211, 212, and 213. The first etch stop layers (821a, 821b, and 821c) are formed at the height $H_1$ with respect to the top surface of the fin structure. The second etch stop layers (822a, 822b, 822c) are formed at the height $H_2$ with respect to the top surface of the fin structure. The height $H_1$ of the first etch stop layer 821 is different than the height $H_2$ of the second etch stop layer 822.

The process of etching sub-channel region of the fins using hardmasks are explained in details with respect to FIGS. 7A-8B above and hence is not discussed again to avoid repetition. In an embodiment, the fin 211 is etched to the first etch stop layer 821a, forming an active channel region 211b with the height $H_1$. In an embodiment, the fin 212 is initially etched to the first etch stop layer 821b. The etch stop layer 821b is then removed either by using a different etchant or longer etching time. Subsequently, the fin 212 is etched to the second etch stop layer 822b, forming an active channel region 212b with the height $H_2$ within the fin structure. In an embodiment, the fin 213 may be etched to the first or second etch stop layers 821c or 822c. As such, fins with multiple active channel heights are formed in a FinFET or a tri-gate device.

Figure 9A:
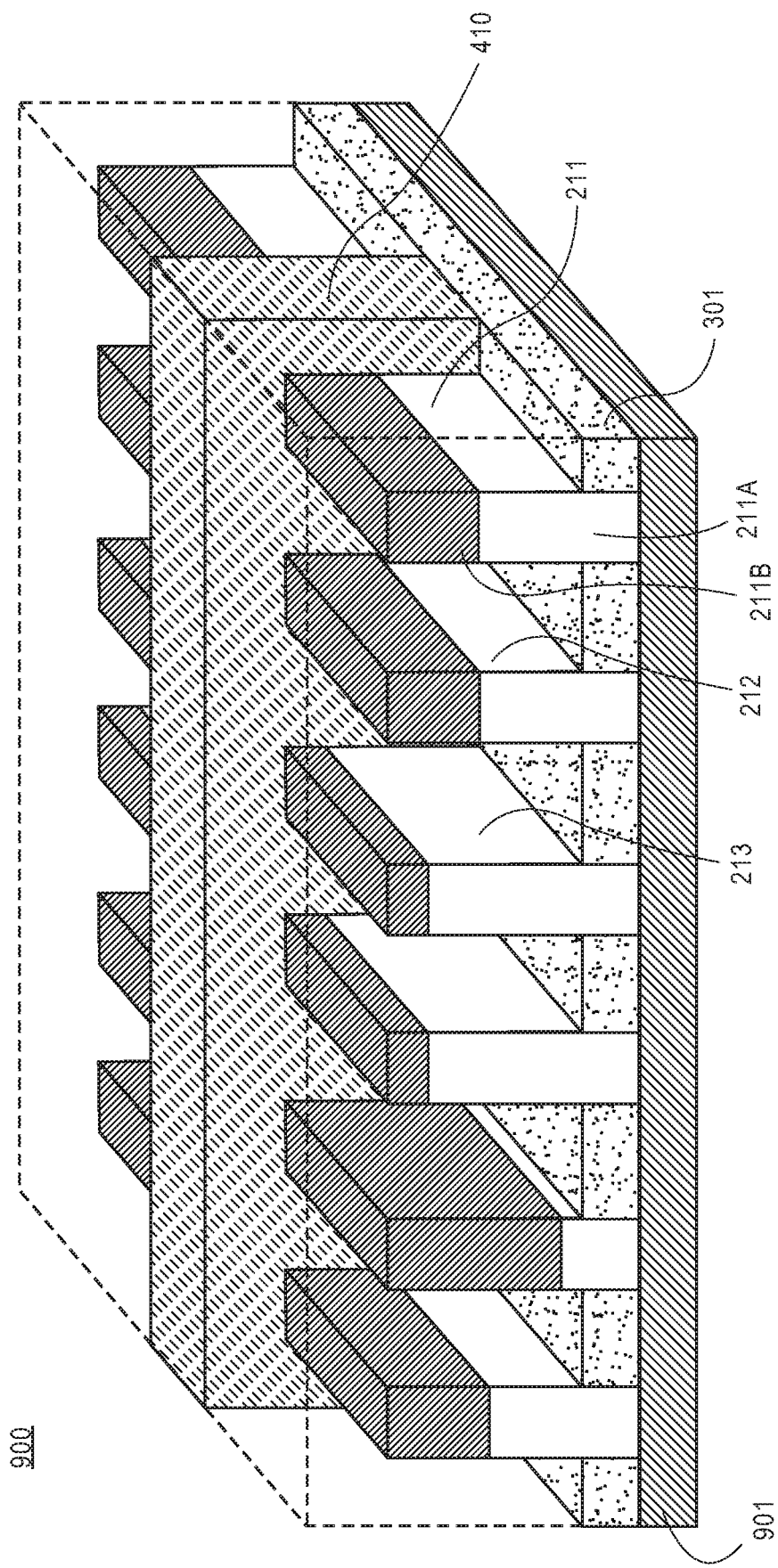
FIG. 9A illustrates a perspective view of the semiconductor structure following the formation of multiple active channel regions with different heights in a device, in accordance with an embodiment of the invention.

Referring to FIG. 9A, a perspective view of the structure 900 is shown following the formation of multiple active channel regions with different heights in a tri-gate or a FinFET device. In an embodiment, the sub-channel region of fins 210 may be filled with dielectric material. In one embodiment, dielectric material is silicon dioxide or a low k dielectric material deposited as a blanket and then polished so that the bottom surface of the fins 210 are at the same level as the bottom surface of dielectric layer 301. In other embodiments, the sub-channel regions of the fins 210 are not filled, forming an airgap in sub-channel regions. In an embodiment, the structure 900 may be placed on top of a base 901 to provide the necessary support for further processes.

Figure 9B:
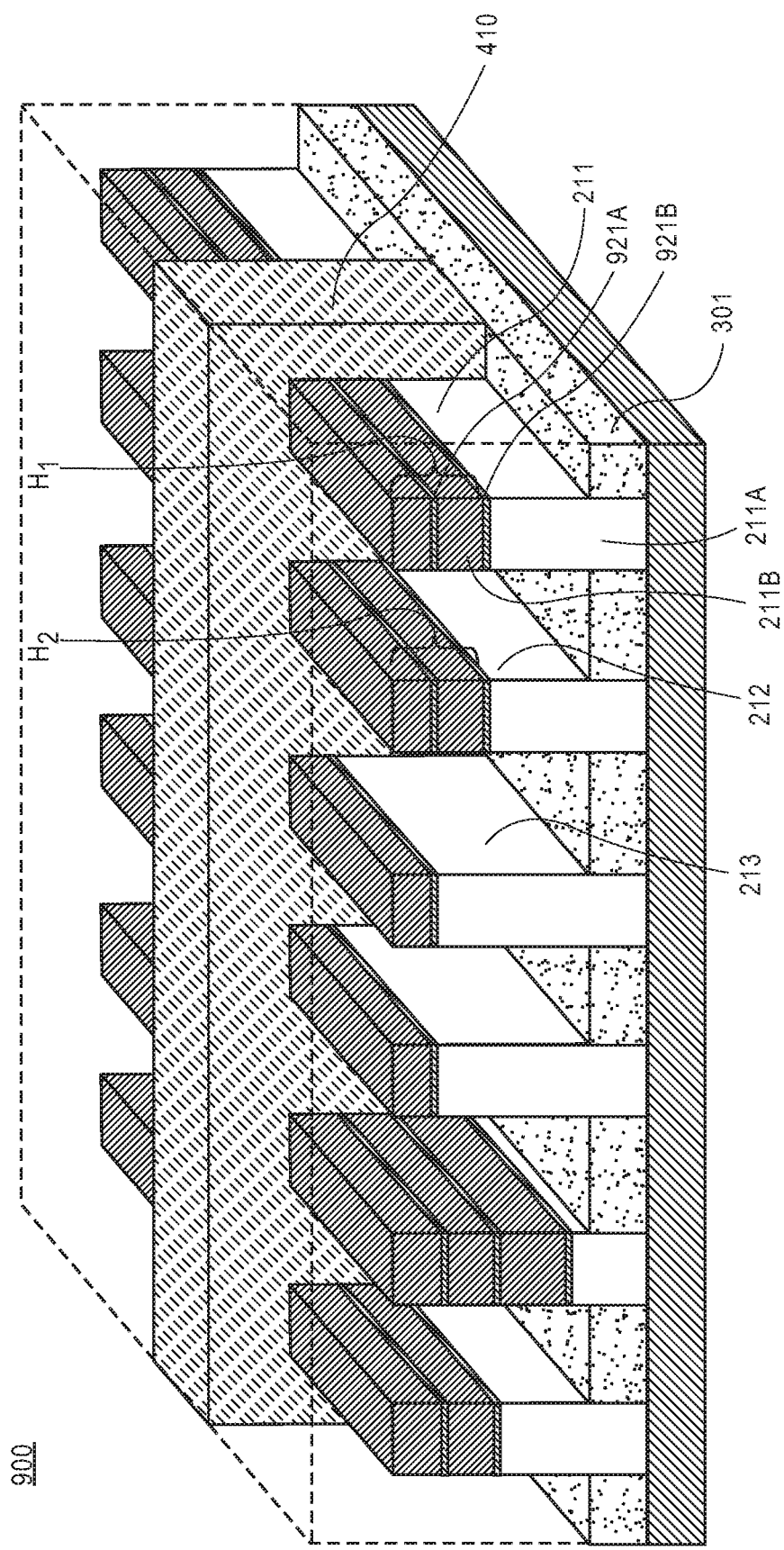
FIG. 9B illustrates a perspective view of the semiconductor structure following the formation of multiple active channel regions with different heights using etch stop layers in a device, in accordance with an embodiment of the invention.

FIG. 9B is a perspective view of the structure 900 following the formation of multiple active channel regions with differing heights using etch stop layers in the device. In an embodiment, the active channel regions are separated from the sub-channel regions by an etch stop layer. For example, the active channel region 211b of the fin 211 is separated from the sub-channel region 211a by the etch stop layer 922a. In other embodiments, the etch stop layer between the sub-channel regions and active channel regions may be removed during the etching process. In an embodiment of invention, the active channel regions may include a single or a plurality of etch stop layers. For example, the active channel layer 211b of the fin 211 includes the etch stop layer 921a. The etch stop layers may be epitaxial layers disposed between semiconductor material of the fins. In other embodiments, the etch stop layers may be ion impurities implanted into the fins.

Figure 9C:
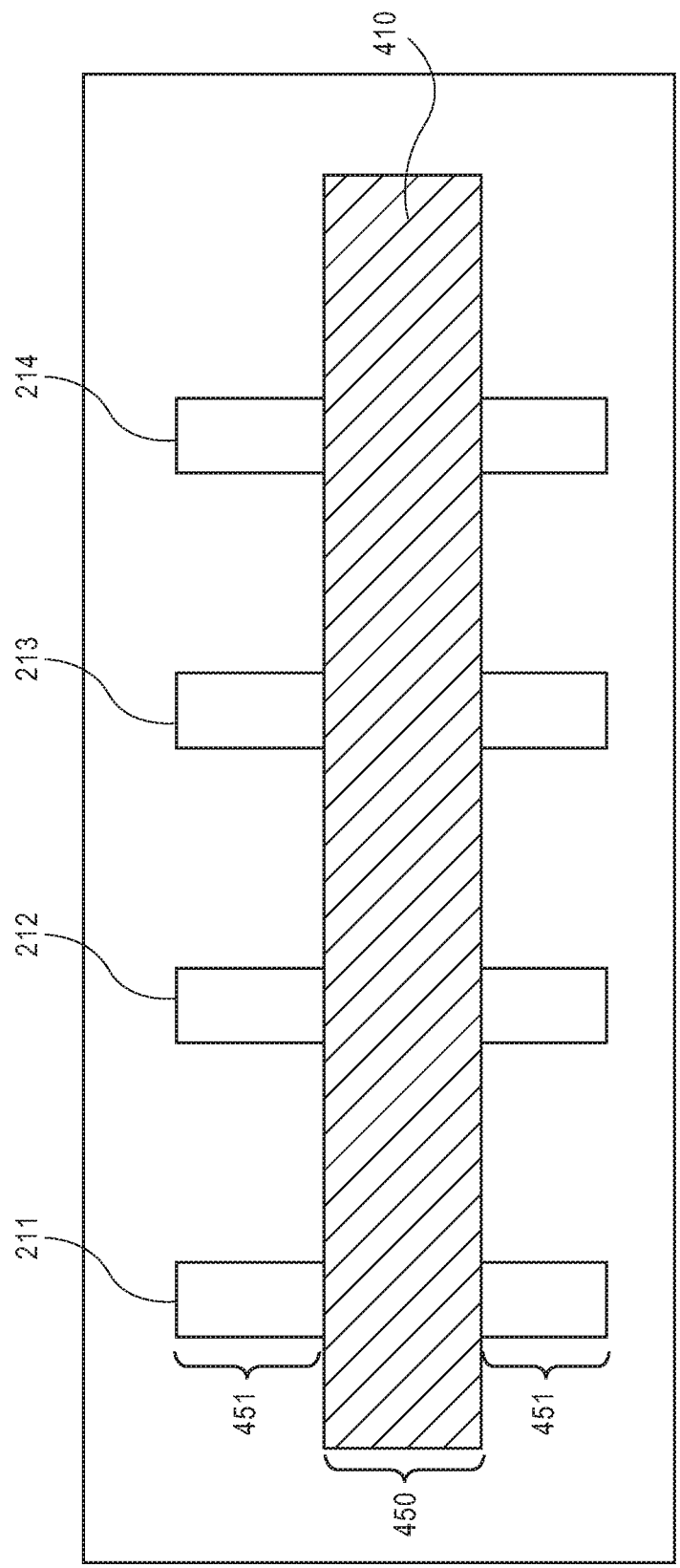
FIG. 9C illustrates a cross-sectional view of the semiconductor structures illustrated in FIGS. 9A and 9B along the line a-a', in accordance with an embodiment of the invention.

FIG. 9C is a top plan view of FIGS. 9A and 9B, following the formation of multiple active channel regions with different heights in a tri-gate or a FinFET device. Source and drain regions 451 and the channel region 450 of the fin 210 can be seen from this perspective. In one embodiment, the original material of the fins 210 in the source and drain regions 451 are doped to form the source and drain of the device. In another embodiment, the material of fins 210 are removed and replaced with another semiconductor material, e.g., by epitaxial deposition. In either case, the source and drain may extend below the height of dielectric layer 301, i.e., into the sub-channel regions.

In an embodiment, the semiconductor structure or device 900 is a non-planar device such as, but not limited to, a Fin-FET or a tri-gate device. In such an embodiment, a corresponding semiconducting channel region is composed of or is formed in a three-dimensional body. In one such embodiment, the gate electrode stacks of gate structure 410 surround at least a top surface and a pair of sidewalls of the active channel regions of fins 210.

Figure 10:
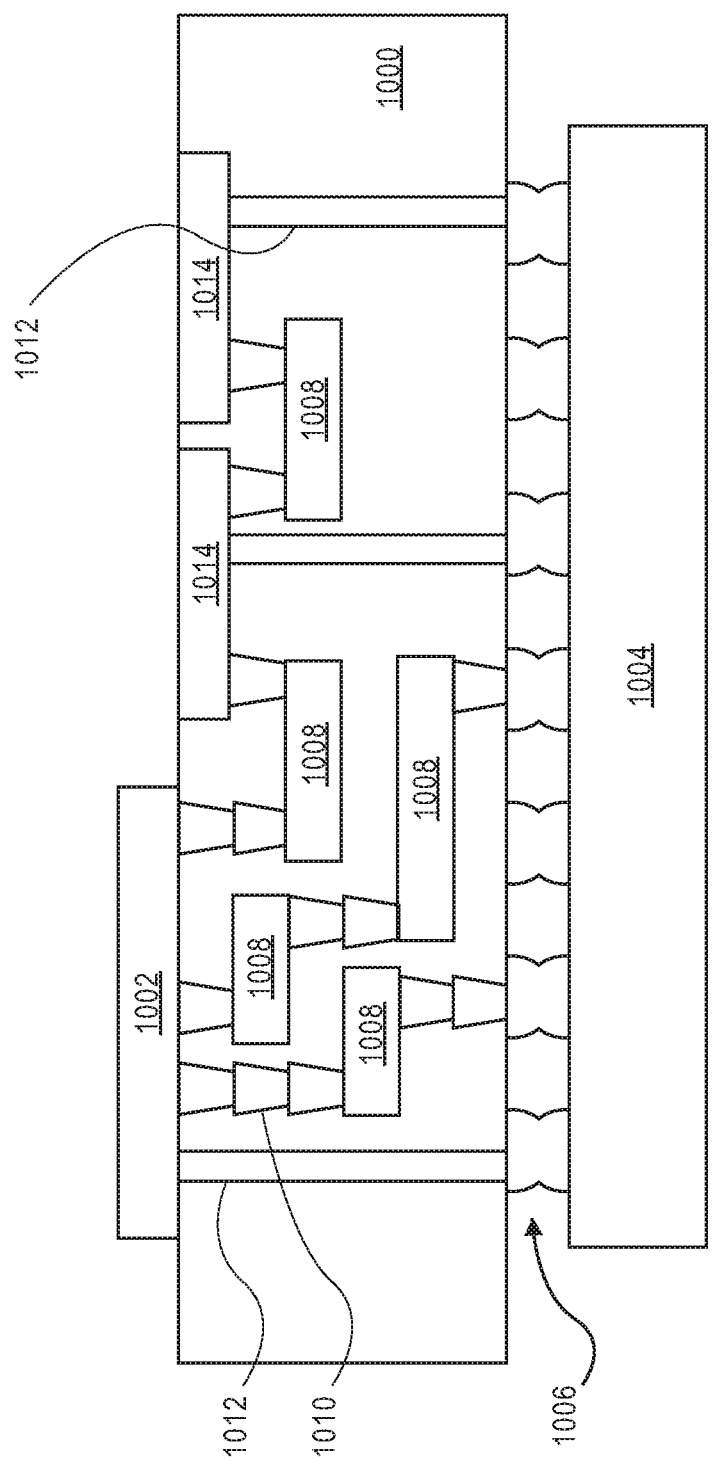
FIG. 10 is a cross-sectional illustration of an interposer implementing one or more embodiments of the invention.

FIG. 10 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses or processes disclosed herein may be used in the fabrication of interposer 1000 or more specifically, the devices 1014 or any other structure that includes a transistor within the interposer.

Figure 11:
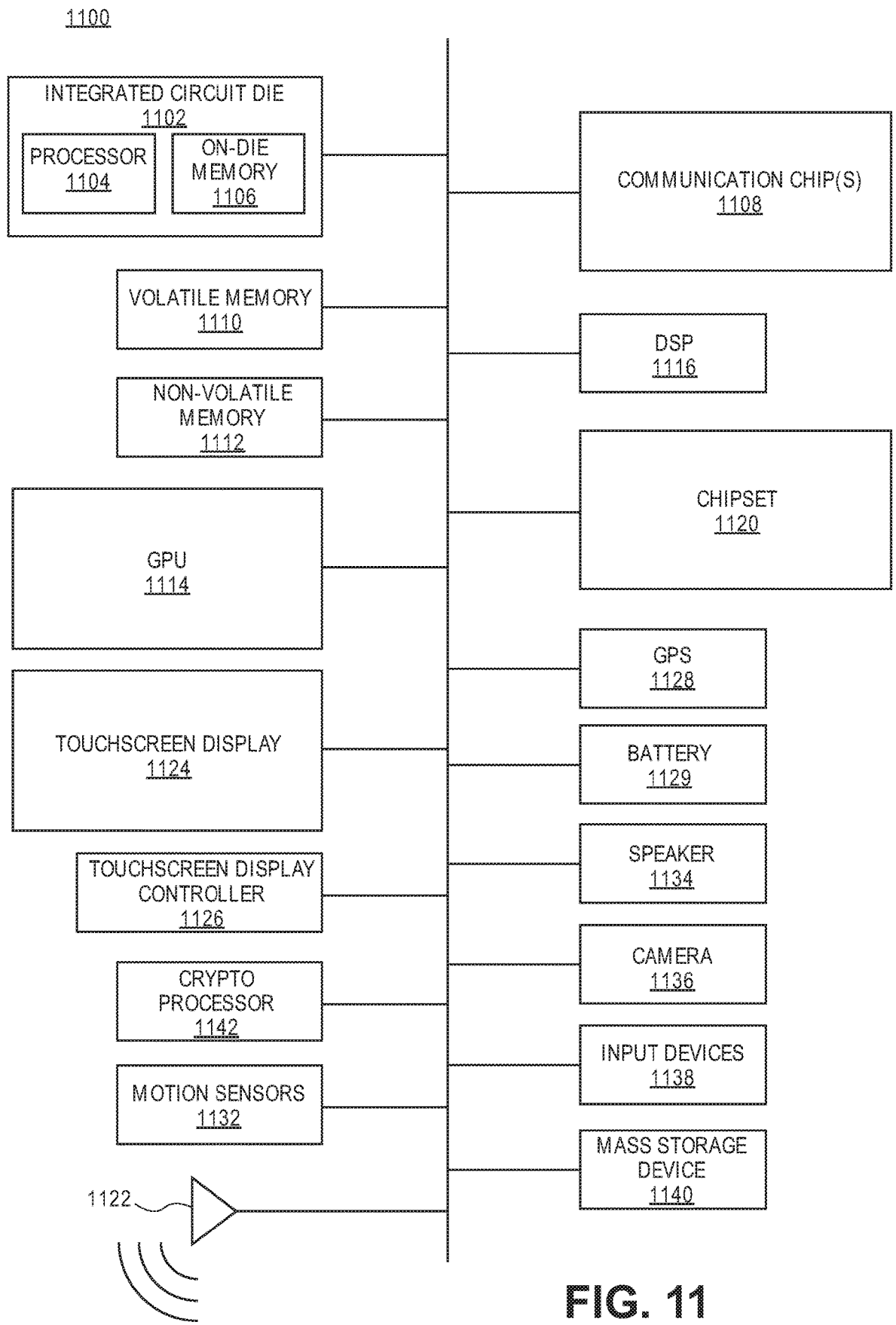
FIG. 11 is a schematic of a computing device built in accordance with an embodiment of the invention.

FIG. 11 illustrates a computing device 1100 in accordance with one embodiment of the invention. The computing device 1100 may include a number of components. In one embodiment, these components are attached to one or more motherboards. In an alternate embodiment, these components are fabricated onto a single system-on-a-chip (SoC) die rather than a motherboard. The components in the computing device 1100 include, but are not limited to, an integrated circuit die 1102 and at least one communication chip 1108. In some implementations the communication chip 1108 is fabricated as part of the integrated circuit die 1102. The integrated circuit die 1102 may include a CPU 1104 as well as on-die memory 1106, often used as cache memory, that can be provided by technologies such as embedded DRAM (eDRAM) or spin-transfer torque memory (STTM or STTM-RAM).

Computing device 1100 may include other components that may or may not be physically and electrically coupled to the motherboard or fabricated within an SoC die. These other components include, but are not limited to, volatile memory 1110 (e.g., DRAM), non-volatile memory 1112 (e.g., ROM or flash memory), a graphics processing unit 1114 (GPU), a digital signal processor 1116, a crypto processor 1142 (a specialized processor that executes cryptographic algorithms within hardware), a chipset 1120, an antenna 1122, a display or a touchscreen display 1124, a touchscreen controller 1126, a battery 1128 or other power source, a power amplifier (not shown), a global positioning system (GPS) device 1128, a compass 1130, a motion coprocessor or sensors 1132 (that may include an accelerometer, a gyroscope, and a compass), a speaker 1134, a camera 1136, user input devices 1138 (such as a keyboard, mouse, stylus, and touchpad), and a mass storage device 1140 (such as hard disk drive, compact disk (CD), digital versatile disk (DVD), and so forth).

The communications chip 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1108. For instance, a first communication chip 1108 may be dedicated to shorter range wireless communications such as Wi-Fi and Bluetooth and a second communication chip 1108 may be dedicated to longer range wireless communications such as GPS, EDGE, GPRS, CDMA, WiMAX, LTE, Ev-DO, and others.

The processor 1104 of the computing device 1100 includes one or more devices, such as non-planar devices disclosed, that are formed in accordance with embodiments of the invention. The term "processor" may refer to any device or portion of a device that processes electronic data from registers and/or memory to transform that electronic data into other electronic data that may be stored in registers and/or memory.

The communication chip 1108 may also include one or more devices, such as non-planar devices disclosed in the disclosure.

In further embodiments, another component housed within the computing device 1100 may contain one or more devices, such as non-planar devices disclose in this disclosure.

In various embodiments, the computing device 1100 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In an embodiment of the invention a semiconductor device includes a first fin and a second fin. The first fin includes a first active channel region on a top portion of the first fin, a first sub-channel region underneath the first active channel region, and a first active channel height from a top surface of the first active channel region to a top surface of the first sub-channel region. The second fin includes a second active channel region on a top portion of the second fin, a second sub-channel region underneath the second active channel region of the second fin, and a second active channel height from a top surface of the second active channel region to a top surface of the second sub-channel region. In an embodiment, the first and second fins have a same height. In an embodiment, the first active channel height is substantially different from the second active channel height.

In an embodiment, the semiconductor device includes etch stop layers between the active channel regions and the sub-channel regions. In an embodiment, the etch stop layers include epitaxial material. In an embodiment, etch stop layers include ion impurities. In an embodiment, the ion impurities compose of a material selected from the group consisting of phosphorous (P), arsenic (As), antimony (Sb), and boron (B).

In an embodiment, the sub-channel regions include an air-gap.

In an embodiment, the sub-channel regions include oxide material.

Embodiments of the invention include a method for fabricating a semiconductor device. The method includes providing a semiconductor substrate having a front surface and a back surface, forming a plurality of fins on the front surface of the substrate, depositing an isolation layer between the plurality of fins such that at least a top portion of the fins are above a top surface of the isolation layer, forming a gate structure in a channel region over the top portion of the fins and over the isolation layer between the fins, exposing the fins from the back surface of the substrate, and etching the fins from the back surface of the substrate to different depths to form active channel regions with differing heights.

In an embodiment, the semiconductor substrate includes a plurality of alternating layers of semiconductor materials and etch stop materials.

In an embodiment, the etch stop materials is epitaxially grown on the semiconductor materials.

In an embodiment, prior to forming the gate structure, the method includes forming a first etch stop layer within the fins by implanting impurity ions into the isolation layer from the front surface of the device.

In one embodiment, prior to forming the gate structure the method further involves, forming a first etch stop layer within the fins by implanting impurity ions into the isolation layer from the front surface of the device.

In an embodiment, the method further involves recessing the isolation layer to expose a region below the top portion of the fins, and forming a second etch stop layer within the fins by implanting impurity ions into the isolation layer from the front surface of the device.

In an embodiment, prior to implanting impurity ions, the method includes forming hardmasks on a top surface of the fins.

In an embodiment, the method includes forming active channel regions with differing heights by controlling an etch time duration of each fin.

Embodiments of the invention include a method for fabricating a semiconductor device. The method includes providing a semiconductor substrate having a front surface and a back surface, forming at least one fin on the front surface of the substrate, depositing an isolation layer on the front surface of the substrate surrounding the fin such that at least a top portion of the fin is above a top surface of the isolation layer, forming a gate structure in a channel region over the top portion of the fin and over the isolation layer, exposing the fin from the back surface of the substrate, and etching at least a portion of the fin from the back surface of the substrate to form an active channel region on the top portion of the fin.

In an embodiment, the fin includes an etch stop layer sandwiched between semiconductor materials of the fin.

In an embodiment, the etch stop layer is epitaxially grown over the semiconductor materials.

In an embodiment, the etch stop layer includes ion impurities.

In an embodiment, prior to etching at least a portion of the fin from the back surface of the substrate, the method involves implanting ion impurities from the back surface to form an etch stop layer within the fin.

What is claimed is:

1. A method for fabricating a semiconductor device, comprising:
    providing a semiconductor substrate having a front surface and a back surface;
    forming a plurality of fins on the front surface of the substrate;
    depositing an isolation layer between the plurality of fins such that at least a top portion of the fins are above a top surface of the isolation layer;
    forming a gate structure in a channel region over the top portion of the fins and over the isolation layer between the fins;
    exposing the fins from the back surface of the substrate; and
    etching the fins from the back surface of the substrate to different depths to form active channel regions with differing heights.

2. The method of claim 1, wherein the semiconductor substrate includes a plurality of alternating layers of semiconductor materials and etch stop materials.

3. The method of claim 2, wherein the etch stop materials is epitaxially grown on the semiconductor materials.

4. The method of claim 1, wherein prior to forming the gate structure, the method comprises forming a first etch stop layer within the fins by implanting impurity ions into the isolation layer from the front surface of the device.

5. The method of claim 4, further comprises:
    recessing the isolation layer to expose a region below the top portion of the fins;
    forming a second etch stop layer within the fins by implanting impurity ions into the isolation layer from the front surface of the device.

6. The method of claim 5, wherein prior to implanting impurity ions, the method comprises forming hardmasks on a top surface of the fins.

7. The method of claim 1, wherein forming active channel regions with differing heights by controlling an etch time duration of each fin.

8. A method for fabricating a semiconductor device, comprising:
    providing a semiconductor substrate having a front surface and a back surface;
    forming at least one fin on the front surface of the substrate;
    depositing an isolation layer on the front surface of the substrate surrounding the fin such that at least a top portion of the fin is above a top surface of the isolation layer;
    forming a gate structure in a channel region over the top portion of the fin and over the isolation layer;
    exposing the fin from the back surface of the substrate; and
    etching at least a portion of the fin from the back surface of the substrate to form an active channel region on the top portion of the fin.

9. The method of claim 8, wherein the fin includes an etch stop layer sandwiched between semiconductor materials of the fin.

10. The method of claim 9, wherein the etch stop layer is epitaxially grown over the semiconductor materials.

11. The method of claim 9, wherein the etch stop layer comprises ion impurities.

12. The method of claim 8, wherein prior to etching at least a portion of the fin from the back surface of the substrate, the method comprises implanting ion impurities from the back surface to form an etch stop layer within the fin.

13. A method for fabricating a computing device, the method comprising:
    forming a component including an integrated circuit structure, the forming comprising:
        providing a semiconductor substrate having a front surface and a back surface;
        forming a plurality of fins on the front surface of the substrate;
        depositing an isolation layer between the plurality of fins such that at least a top portion of the fins are above a top surface of the isolation layer;
        forming a gate structure in a channel region over the top portion of the fins and over the isolation layer between the fins;
        exposing the fins from the back surface of the substrate; and
        etching the fins from the back surface of the substrate to different depths to form active channel regions with differing heights; and
    coupling the component to a board.

14. The method of claim 13, further comprising: coupling a memory to the board.

15. The method of claim 13, further comprising: coupling a communication chip to the board.

16. The method of claim 13, further comprising: coupling a battery to the board.

17. The method of claim 13, further comprising: coupling a camera to the board.

18. The method of claim 13, further comprising: coupling an antenna to the board.

19. The method of claim 13, further comprising: prior to the coupling the component to the board, packaging the component to form a packaged integrated circuit die, wherein coupling the component to the board comprises coupling the packaged integrated circuit die to the board.

20. The method of claim 13, wherein the component is selected from the group consisting of a processor, a communications chip, and a digital signal processor.

* * * * *